United States Patent [19]
Igata et al.

[11] Patent Number: 6,057,790
[45] Date of Patent: May 2, 2000

[54] APPARATUS AND METHOD FOR DATA COMPRESSION/EXPANSION USING BLOCK-BASED CODING WITH TOP FLAG

[75] Inventors: Nobuyuki Igata; Isao Namba; Kunio Matsui, all of Kawasaki, Japan

[73] Assignee: Fujitsu Limited, Kawasaki, Japan

[21] Appl. No.: 08/922,676

[22] Filed: Sep. 3, 1997

[30] Foreign Application Priority Data

Feb. 28, 1997 [JP] Japan ................................. 9-045424

[51] Int. Cl.[7] ................................................. H03M 7/30
[52] U.S. Cl. ............................... 341/95; 341/50; 707/101
[58] Field of Search ................................. 341/50, 95, 55; 707/101

[56] References Cited

U.S. PATENT DOCUMENTS

| | | | |
|---|---|---|---|
| 4,562,423 | 12/1985 | Humblet | 341/67 |
| 5,363,098 | 11/1994 | Antoshenkov | 341/95 |
| 5,701,459 | 12/1997 | Millett et al. | 707/101 |

FOREIGN PATENT DOCUMENTS 0 601 569   6/1994   European Pat. Off. .

OTHER PUBLICATIONS

A. Moffat, "Self–Indexing Inverted Files for Fast Text Retrieval", *ACM Transactions on Information Systems*, vol. 14, No. 4, Oct. 1996, pp. 349–379.

J. Zobel, "Efficient Retrieval of Partial Documents", *Information Processing & Management*, vol. 31, No. 3, 1995, pp. 361–377.

*Primary Examiner*—Howard L. Williams
*Attorney, Agent, or Firm*—Staas & Halsey

[57] ABSTRACT

A compression unit compresses original data in block units and encodes compressed data, and it generates continuation flag information expressive of the block length of the compressed data at the top part of the compressed data stored in a storage unit. An expansion unit determines the block length of the remaining data of the compressed data on the basis of the continuation flag information, fetches the remaining data from the storage unit and restores the original data.

58 Claims, 41 Drawing Sheets

| KEY | [DOCUMENT NO., NUMBER OF OCCURRENCES OF WORD WITHIN DOCUMENT], [], ··· |
|---|---|
| DOG | [1,1], [2,1], [3,2], [25,3], |

F I G. 1

| ORIGINALS AND DOCUMENT SIZE | INDEX SIZE |
|---|---|
| ABSTRACTS OF PATENTS, 800,000 ITEMS (600Mbytes)<br>COMPLETE DOCUMENTS OF PATENTS, 190,000 ITEMS (2.8Gbytes)<br>COMPLETE DOCUMENTS OF NEWSPAPERS, 920,000 ITEMS (1.0Gbyte) | 1.0G(=269009635*4 bytes)<br>0.7G(=193819787*4 bytes)<br>1.3G(=358299176*4 bytes) |

F I G. 2

| KEY | [DOCUMENT NO., NUMBER OF OCCURRENCES OF WORD WITHIN DOCUMENT], [], ··· |
|-----|-----------------------------------------------------------------------|
| DOG | [1,1], [1,1], [1,2], [22,3] |

F I G. 3

| DOG | | [1,1],[1,1],[1,2],[22,3] (ORIGINAL DATA) |
|---|---|---|
| CODING SCHEME | TOTAL NUMBER OF bits | NUMBERS OF bits NECESSARY FOR EXPRESSING RESPECTIVE NUMERICAL VALUES |
| 32bit (WITHOUT COMPRESSION) | 256 | [32,32],[32,32],[32,32],[32,32] |
| 8bit block | 64 | [ 8, 8],[ 8, 8],[ 8, 8],[ 8, 8] |
| 4bit block | 36 | [ 4, 4],[ 4, 4],[ 4, 4],[ 8, 4] |
| Unary | 32 | [ 1, 1],[ 1, 1],[ 1, 2],[22, 3] |
| γ | 22 | [ 1, 1],[ 1, 1],[ 1, 3],[11, 3] |
| δ | 20 | [ 1, 1],[ 1, 1],[ 1, 3],[10, 2] |

FIG. 4

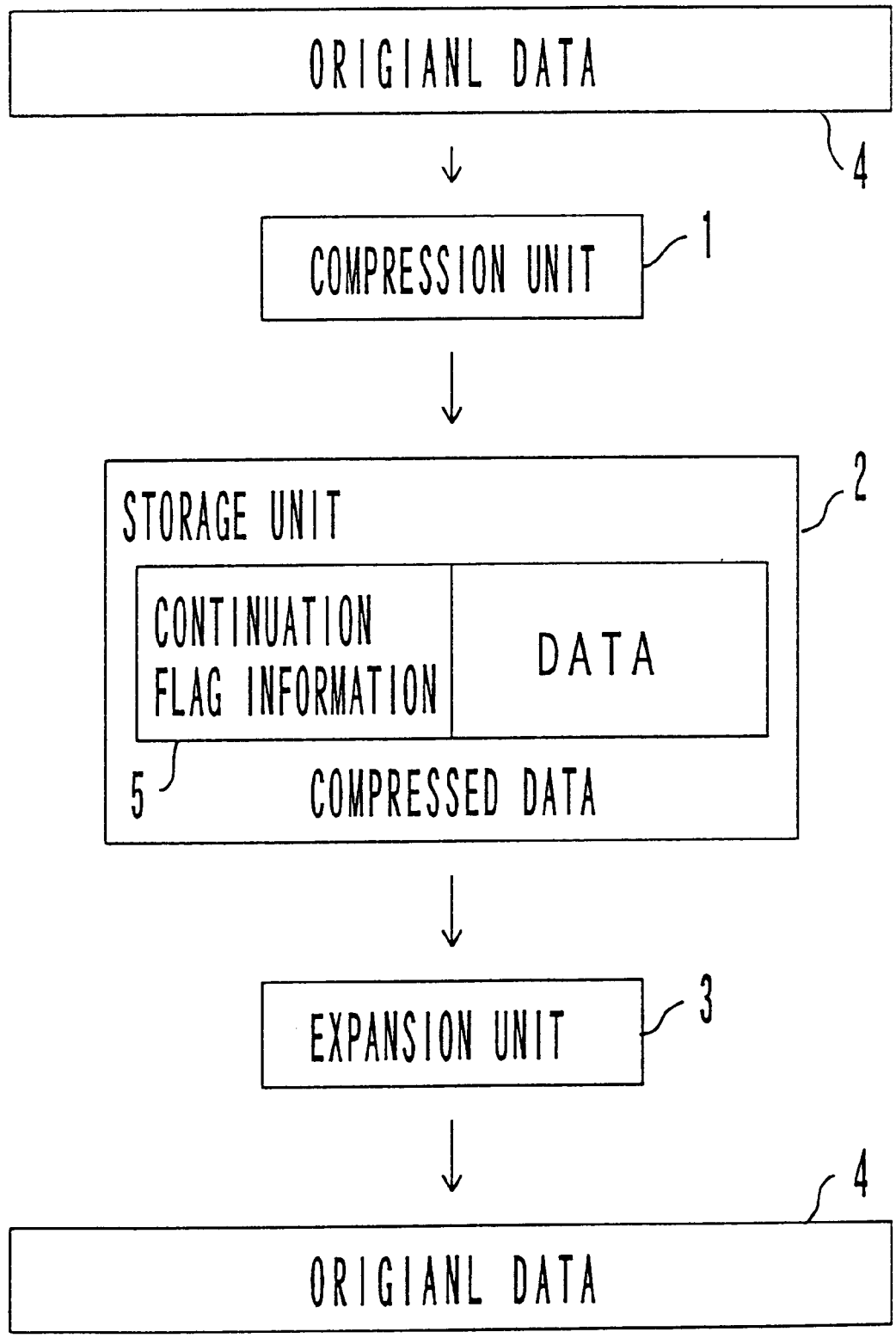
F I G. 5

```
/* EXAMPLE OF encode PROGRAM OF 4-bit block CODING */
/* Bitbuf DENOTES VARIABLE IN WHICH ENCODED bit PATTERN IS SET */
/* Value DENOTES ORIGINAL DATA TO BE ENCODED */
void encode_4bitblock (BitString *Bitbuf, unsigned long Value)
{
  int i;
  unsigned char Code [ 12 ];

i = 11;
  Code [ i ] = Value & 0x7;
  Value >> = 3;
  while (Value > 0) {
    i--;
    Code [ i ] = 0x8 | (value & 0x7);
    Value >> = 3;
  }
  while (i < 12) {
    set_4bits (Bitbuf, Code [ i ]);   /* SET VALUE OF Code [ i ] IN Bitbuf IN 4-bit block CODING */
    i++;
  }
}
```

FIG. 8

```
/* EXAMPLE OF decode PROGRAM OF 4-bit block CODING */
/* Bitbuf DENOTES VARIABLE IN WHICH ENCODED bit PATTERN HAS BEEN SET */
/* DECODED VALUE IS BROUGHT BACK AS RETURN VALUE */
int decode_4bitblock (BitString *Bitbuf)
{
  unsigned long Value;
  int temp;
  Value = get_4bits (Bitbuf); /* READ VALUE OF 4 bits FROM Bitbuf AND WRITE IT INTO Value */
  if (Value > 0x7)
  {
    Value & = 0x7;
    do {
        temp = get_4bits (Bitbuf); /* READ VALUE OF 4 bits FROM Bitbuf AND WRITE IT INTO temp */
        Value = (Value << 3) | (temp & 0x7);
    } while (temp > 0x7);
  }
  return Value;
}
```

FIG. 10

```
/* EXAMPLE OF encode PROGRAM OF ADVANCED 4-bit block CODING */
/* Bitbuf DENOTES VARIABLE IN WHICH ENCODED bit PATTERN IS SET */
/* Value DENOTES ORIGINAL DATA TO BE ENCODED */
void encode_4bitblock_kai (BitString *Bitbuf, unsigned long Value)
{
    if (Value<8)                    /*0: CONTINUATION FLAG */
        set_4bits (Bitbuf, Value);
    else if (Value<64)              /*10: CONTINUATION FLAG */
        set_8bits (Bitbuf, (Value | 0x80));
    else if (Value<512)             /*110: CONTINUATION FLAG */
        set_12bits (Bitbuf, (Value | 0xc00));
    else if (Value<4096)            /*1110: CONTINUATION FLAG */
        set_16bits (Bitbuf, (Value | 0xe000));
    else if (Value<32768)           /*11110: CONTINUATION FLAG */
        set_20bits (Bitbuf, (Value | 0xf0000));
    else if (Value<262144)          /*111110: CONTINUATION FLAG */
        set_24bits (Bitbuf, (Value | 0xf80000));
    else if (Value<2097152)         /*1111110: CONTINUATION FLAG */
        set_28bits (Bitbuf , (Value | 0xfc00000));
    else if (Value<16777216)        /*11111110: CONTINUATION FLAG */
        set_32bits (Bitbuf, (Value | 0xfe000000));
    else if (Value<134217728)       /*111111110: CONTINUATION FLAG */
    {
        set_4bits (Bitbuf, 0xf);
        set_32bits (Bitbuf, (Value | 0xf0000000));
    }
    else if (Value<1073741824)      /*1111111110: CONTINUATION FLAG */
    {
        set_8bits (Bitbuf, 0xff);
        set_32bits (Bitbuf, (Value | 0x80000000));
    }
    else                            /*11111111110: CONTINUATION FLAG */
    {
        set_12bits (Bitbuf, 0xffc);
        set_32bits (Bitbuf, Value);
    }
}
```

FIG. 12

```c
/* EXAMPLE OF decode PROGRAM OF ADVANCED 4-bit block CODING */
/* Bitbuf DENOTES VARIABLE IN WHICH ENCODED bit PATTERN HAS BEEN SET */
/* DECODED VALUE IS BROUGHT BACK AS RETURN VALUE */
int decode_4bitblock_kai (BitString *Bitbuf)
{
  int Value;

Value = get_4bits (Bitbuf);
  if (Value<8)        /*0*/
     return Value;
  else if (Value<12)  /*10*/
     return ((Value&0x03) <<4 | get_4bits (Bitbuf));
  else if (Value<14)  /*110*/
     return ((Value&0x01) <<8 | get_8bits (Bitbuf));
  else if (Value==14) /*1110*/
     return (get_12bits (Bitbuf));
  else
  {
    Value = get_4bits (Bitbuf);
    if (Value<8)        /*11110*/
      return ((Value&0x7) <<12 | get_12bits (Bitbuf));
    else if (Value<12)  /*111110*/
      return ((Value&0x3) <<16 | get_16bits (Bitbuf));
    else if (Value<14)  /*1111110*/
      return ((Value&0x1) <<20 | get_20bits (Bitbuf));
    else if (Value==14) /*11111110*/
      return (get_24bits (Bitbuf));
    else
    {
      Value = get_4bits (Bitbuf);
      if (Value<8)        /*111111110*/
         return ((Value&0x7) | get_24bits (Bitbuf));
      else if (Value<12)  /*1111111110*/
         return ((Value&0x3) <<28 | get_28bits (Bitbuf));
      else                /*11111111110*/
         return ((Value&0x1) | get_32bits (Bitbuf));
    }
  }
}
```

FIG. 14

```
/* EXAMPLE OF encode PROGRAM OF 84BB CODING */
/* Bitbuf DENOTES VARIABLE IN WHICH ENCODED bit PATTERN IS SET */
/* Value DENOTES ORIGINAL DATA TO BE ENCODED */
void encode_8_4bitblock (BitString *Bitbuf, unsigned long Value)
{
  if (Value<128)                /*0*/
    set_8bits (Bitbuf, Value);
  else if (Value<1024)          /*10*/
    set_12bits (Bitbuf, (Value | 0x800));
  else if (Value<8192)          /*110*/
    set_16bits (Bitbuf, (Value | 0xc000));
  else if (Value<65536)         /*1110*/
    set_20bits (Bitbuf, (Value | 0xe0000));
  else if (Value<524288)        /*11110*/
    set_24bits (Bitbuf, (Value | 0xf00000));
  else if (Value<4194304)       /*111110*/
    set_28bits (Bitbuf, (Value | 0xf800000));
  else if (Value<33554432)      /*1111110*/
    set_32bits (Bitbuf , (Value | 0xfc000000));
  else if (Value<268435456)     /*11111110*/
  {
    set_4bits (Bitbuf, 0xf);
    set_32bits (Bitbuf, (Value | 0xe0000000));
  }
  else if (Value<=2147483647) /* 111111110 */
  {
    set_8bits (Bitbuf, 0xff);
    set_32bits (Bitbuf, Value);
  }
  else                          /* 1111111110 */
  {
    set_8bits (Bitbuf, 0xff);
    set_32bits (Bitbuf, (Value | 0x80000000));
  }
}
```

FIG. 16

```c
/* EXAMPLE OF decode PROGRAM OF 84BB CODING */
/* Bitbuf DENOTES VARIABLE IN WHICH ENCODED bit PATTERN HAS BEEN SET */
/* DECODED VALUE IS BROUGHT BACK AS RETURN VALUE */
int decode_8_4bitblock (BitString *Bitbuf)

{
  int Value;

Value = get_8bits (Bitbuf);
  if (Value<0x80)              /*0*/
     return (Value);
  else if (Value<0xc0)         /*10*/
     return ((Value&0x3f) <<4 | get_4bits (Bitbuf));
  else if (Value<0xe0)         /*110*/
     return ((Value&0x1f) <<8 | get_8bits (Bitbuf));
  else if (Value<0xf0)         /*1110*/
     return ((Value&0x0f) <<12 | get_12bits (Bitbuf));
  else if (Value<0xf8)         /*11110*/
     return ((Value&0x07) <<16 | get_16bits (Bitbuf));
  else if (Value<0xfc)         /*111110*/
     return ((Value&0x03) <<20 | get_20bits (Bitbuf));
  else if (Value<0xfe)         /*1111110*/
     return ((Value&0x01) <<24 | get_24bits (Bitbuf));
  else if (Value==0xfe)        /*11111110*/
     return (get_28bits (Bitbuf));
  else {
    Value = get_4bits (Bitbuf);
    if (Value<0x8)             /*111111110*/
       return (Value <<28 | get_28bits (Bitbuf));
    else                       /*1111111110*/
       return ((Value&0x03) <<32 | get_32bits (Bitbuf));
  }
}
```

FIG. 18

```
/* EXAMPLE OF encode PROGRAM OF B24 CODING */
/* Bitbuf DENOTES VARIABLE IN WHICH ENCODED bit PATTERN IS SET */
/* Value DENOTES ORIGINAL DATA TO BE ENCODED */
void encode_bin_2_4bitblock (BitString *Bitbuf, unsigned long Value)
{
  if (Value == 1)            /*0*/
     set_2bits (Bitbuf, 0);
  else if (Value == 2)       /*0*/
     set_2bits (Bitbuf, 1);
  else if (Value<7)          /*10*/
     set_4bits (Bitbuf, (Value-3) | 0x8);
  else if (Value<39)         /*110*/
     set_8bits (Bitbuf, (Value-7) | 0xc0);
  else if (Value<263)        /*1110*/
     set_12bits (Bitbuf, (Value-7) | 0xe00);
  else if (Value<2055)       /*11110*/
     set_16bits (Bitbuf, (Value-7) | 0xf000);
  else if (Value<16391)      /*111110*/
     set_20bits (Bitbuf, (Value-7) | 0xf8000);
  else if (Value<131079)     /*1111110*/
     set_24bits (Bitbuf, (Value-7) | 0xfc0000);
  else if (Value<1048583)    /*11111110*/
     set_28bits (Bitbuf, (Value-7) | 0xfe00000);
  else if (Value<8388615)    /*111111110*/
     set_32bits (Bitbuf, (Value-7) | 0xff000000);
  else if (Value<67108871)   /*1111111110*/
  {
     set_4bits (Bitbuf, 0xf);
     set_32bits (Bitbuf, (Value-7) | 0xf8000000);
  }
  else if (Value<536870919   /*11111111110*/
  {
     set_8bits (Bitbuf, 0xff);
     set_32bits (Bitbuf, (Value-7) | 0xc0000000);
  }
  else                       /*111111111110*/
  {
     set_12bits (Bitbuf, 0xffe);
     set_32bits (Bitbuf, (Value-7));
  }
}
```

FIG. 20

```
/* EXAMPLE OF decode PROGRAM OF B24 CODING */
/* Bitbuf DENOTES VARIABLE IN WHICH ENCODED bit PATTERN HAS BEEN SET */
/* DECODED VALUE IS BROUGHT BACK AS RETURN VALUE */
int decode_bin_2_4bitblock (BitString *Bitbuf)
{
  int Value;

Value = get_2bits (Bitbuf);
  if (Value<2)                    /*0*/
    return (Value+1);
  else if (Value<3)               /*10*/
    return (get_2bits (Bitbuf) +3);
  else if (Value==3)
  {
    Value = get_2bits (Bitbuf);
    else if (Value < 2)           /*110*/
      return (((Value&0x01) <<4 | get_4bits (Bitbuf)) +7);
    else if (Value == 2)          /*1110*/
      return (get_8bits (Bitbuf)) +7);
    else if (Value == 3)
    {
      Value = get_4bits (Bitbuf);
      else if (Value<8)           /*11110*/
        return (((Value<<8) | get_8bits (Bitbuf)) +7);
      else if (Value<12)          /*111110*/
        return (((Value&0x03) <<12 | get_12bits (Bitbuf)) +7);
      else if (Value<14)          /*1111110*/
        return (((Value&0x01) <<16 | get_16bits (Bitbuf)) +7);
      else if (Value==14)         /*11111110*/
        return (get_20bits (Bitbuf) +7);
      else
      {
        Value = inv_get_4bits (Bitbuf);
        if (Value<8)              /*111111110*/
          return ((Value<<20) | get_20bits (Bitbuf)) +7);
        else if (Value<12)        /*1111111110*/
          return (((Value&0x03) <<24 | get_24bits (Bitbuf)) +7);
        else if (Value<14)        /*11111111110*/
          return (((Value&0x01) <<28 | get_28bits (Bitbuf)) +7);
        else                      /*111111111110*/
          return (get_32bits (Bitbuf) +7);
      }
    }
  }
}
```

FIG. 22

| VALUE | 4 BIT BLOCK | 8 BIT BLOCK | ADVANCED 4BB | B24 | 84BB | γ | δ |
|---|---|---|---|---|---|---|---|
| 1 | 4 | 8 | 4 | 2 | 8 | 1 | 1 |
| 2 | 4 | 8 | 4 | 2 | 8 | 3 | 4 |
| 3 | 4 | 8 | 4 | 4 | 8 | 3 | 4 |
| 4 | 4 | 8 | 4 | 4 | 8 | 5 | 5 |
| 5 | 4 | 8 | 4 | 4 | 8 | 5 | 5 |
| 6 | 4 | 8 | 4 | 4 | 8 | 5 | 5 |
| 7 | 4 | 8 | 4 | 4 | 8 | 5 | 5 |
| 8 | 8 | 8 | 8 | 8 | 8 | 7 | 8 |
| 16 | 8 | 8 | 8 | 8 | 8 | 9 | 9 |
| 32 | 8 | 16 | 8 | 8 | 12 | 11 | 10 |
| 64 | 12 | 16 | 12 | 12 | 12 | 13 | 11 |
| 128 | 12 | 16 | 12 | 12 | 12 | 15 | 14 |
| 256 | 12 | 16 | 12 | 12 | 16 | 17 | 15 |
| 512 | 16 | 16 | 16 | 16 | 16 | 19 | 16 |
| 1024 | 16 | 16 | 16 | 16 | 16 | 21 | 17 |
| 2048 | 16 | 24 | 16 | 16 | 20 | 23 | 18 |
| 4096 | 20 | 24 | 20 | 20 | 20 | 25 | 19 |
| 8192 | 20 | 24 | 20 | 20 | 20 | 27 | 20 |
| 16384 | 20 | 24 | 20 | 20 | 24 | 29 | 21 |
| 32768 | 24 | 24 | 24 | 24 | 24 | 31 | 22 |
| 65536 | 24 | 24 | 24 | 24 | 24 | 33 | 25 |
| 131072 | 24 | 24 | 24 | 24 | 24 | 35 | 26 |
| 262144 | 28 | 24 | 28 | 28 | 28 | 37 | 27 |
| 524288 | 28 | 24 | 28 | 28 | 28 | 39 | 28 |
| 1048576 | 28 | 24 | 28 | 28 | 28 | 41 | 29 |

FIG. 23

| CODING SCHEME | TOTAL NUMBER OF bits | bit PATTERN |
|---|---|---|
| 8bit block | 40 | 1000 1111 1111 1111 1111 1111 1111 1111 1111 0111 1111 |
| 4bit block | 44 | 1011 1111 1111 1111 1111 1111 1111 1111 1111 0111 0111 |
| γ | 63 | 1111 1111 1111 1111 1111 1111 1111 1111 1111 0 1111 1111 1111 1111 1111 1111 1111 |
| δ | 42 | 1111 0000 0001 1111 1111 1111 1111 1111 1111 1111 1111 |
| ADVANCED 4BB | 44 | 1111 1111 1100 1111 1111 1111 1111 1111 1111 1111 1111 |
| B 2 4 | 44 | 1111 1111 1110 1111 1111 1111 1111 1111 1111 1111 1111 |
| 8 4 B B | 44 | 1111 1111 1000 1111 1111 1111 1111 1111 1111 1111 1111 |

FIG. 24

| KEY | [DOCUMENT NO., NUMBER OF OCCURRENCES OF WORD WITHIN DOCUMENT, NUMBER OF AREAS OF OCCURRING POSITIONS OF WORD WITHIN DOCUMENT, OCCURRING POSITIONS OF WORD WITHIN DOCUMENT, ···] , [] , ··· |
|---|---|
| DOG | [1,1,?,16] , [1,1,?,250] , [1,2,?,160,120] , [22,3,?,45,55,1150] , |

F I G. 2 7

| DOG | 128 | [1],[1],[1],[22] (ORIGINAL DATA : DECIMAL NUMBERS) |
|---|---|---|
| CODING SCHEME | TOTAL NUMBER OF bits | bit PATTERN |
| ADVANCED 4BB | 20 | [0001],[0001],[0001],[10010110] |
| B 2 4 | 12 | [00],[00],[00],[11001111] |

FIG. 28

| DOG | 256 | [1,1],[1,1],[1,2],[22,3] (ORIGINAL DATA : DECIMAL NUMBERS) |
|---|---|---|
| CODING SCHEME | TOTAL NUMBER OF bits | bit PATTERN |
| COMBINATION 1 | 36 | [0001,0001],[0001,0001],[0001,0010],[10010110,0011] |
| COMBINATION 2 | 36 | [0001,0001],[0001,0001],[0001,0001],[10010110,0001] |
| COMBINATION 3 | 28 | [0001,00],[0001,00],[0001,00],[10010110,00] |
| COMBINATION 4 | 24 | [00,00],[00,00],[00,01],[11001111,1000] |
| COMBINATION 5 | 30 | [00,0001],[00,0001],[00,0001],[11001111,0001] |
| COMBINATION 6 | 16 | [00,00],[00,00],[00,00],[11001111,00] |

FIG. 29

| DOG | 480 | [1,1,16], [1,1,250], [1,2,160,120], [22,3,45,55,1150] (ORIGINAL DATA: DECIMAL NUMBERS) |
|---|---|---|
| CODING SCHEME | TOTAL NUMBER OF bits | bit PATTERN |
| COMBINATION 1 | 112 | [0001, 0001, 10010000],<br>[0001, 0001, 110011111010],<br>[0001, 0010, 110010100000, 110001111000],<br>[10010110, 0011, 10101101, 10110111, 1110010001111110] |
| COMBINATION 2 | 80 | [0001, 0001, 0001],<br>[0001, 0001, 10001111],<br>[0001, 0010, 10001010, 0111],<br>[10010110, 0011, 0010, 0011, 110001000111] |
| COMBINATION 3 | 120 | [0001, 0001, 11001001],<br>[0001, 0001, 111011110011],<br>[0001, 0010, 111010011001, 111001110001],<br>[10010110, 0011, 111000100110, 111000110000, 1111010001110111] |
| COMBINATION 4 | 78 | [0001, 0001, 00],<br>[0001, 0001, 11001000],<br>[0001, 0010, 11000011, 11000000],<br>[10010110, 0011, 01, 10, 111001000000] |
| COMBINATION 5 | 106 | [0001, 00, 10010000],<br>[0001, 00, 110011111010],<br>[0001, 01, 110010100000, 110001111000],<br>[10010110, 1000, 10101101, 10110111, 1110010001111110] |
| COMBINATION 6 | 74 | [0001, 00, 0001],<br>[0001, 00, 10001111],<br>[0001, 01, 10001010, 0111],<br>[10010110, 1000, 0010, 0011, 110001000111] |
| COMBINATION 7 | 114 | [0001, 00, 11001001],<br>[0001, 00, 111011110011],<br>[0001, 01, 111010011001, 111001110001],<br>[10010110, 1000, 111000100110, 111000110000, 1111010001110111] |
| COMBINATION 8 | 72 | [0001, 00, 00],<br>[0001, 00, 11001000],<br>[0001, 01, 11000011, 11000000],<br>[10010110, 1000, 01, 10, 111001000000] |

FIG. 30

| DOG | 480 | [1,1,16], [1,1,250], [1,2,160,120], [22,3,45,55,1150] | (ORIGINAL DATA: DECIMAL NUMBERS) |
|---|---|---|---|
| CODING SCHEME | TOTAL NUMBER OF bits | bit PATTERN | |
| COMBINATION 9 | 106 | [00, 0001, 10010000],<br>[00, 0001, 110011111010],<br>[00, 0010, 110010100000, 110001111000],<br>[11001111, 0011, 10101101, 10110111, 1110010001111110] | |
| COMBINATION 10 | 74 | [00, 0001, 0001],<br>[00, 0001, 10001111],<br>[00, 0010, 10001010, 0111],<br>[11001111, 0011, 0010, 0011, 110001000111] | |
| COMBINATION 11 | 114 | [00, 0001, 11001001],<br>[00, 0001, 111011110011],<br>[00, 0010, 111010011001, 111001110001],<br>[11001111, 0011, 111000100110, 111000110000, 1111010001110111] | |
| COMBINATION 12 | 72 | [00, 0001, 00],<br>[00, 0001, 11001000],<br>[00, 0010, 11000011, 11000000],<br>[11001111, 0011, 01, 10, 111001000000] | |
| COMBINATION 13 | 100 | [00, 00, 10010000],<br>[00, 00, 110011111010],<br>[00, 01, 110010100000, 110001111000],<br>[11001111, 1000, 10101101, 10110111, 1110010001111110] | |
| COMBINATION 14 | 68 | [00, 00, 0001],<br>[00, 00, 10001111],<br>[00, 01, 10001010, 0111],<br>[11001111, 1000, 0010, 0011, 110001000111] | |
| COMBINATION 15 | 108 | [00, 00, 11001001],<br>[00, 00, 111011110011],<br>[00, 01, 111010011001, 111001110001],<br>[11001111, 1000, 111000100110, 111000110000, 1111010001110111] | |
| COMBINATION 16 | 66 | [00, 00, 00],<br>[00, 00, 11001000],<br>[00, 01, 11000011, 11000000],<br>[11001111, 1000, 01, 10, 111001000000] | |

FIG. 31

| DOG | 480 | [1,1,16], [1,1,250], [1,2,160,120], [22,3,45,55,1150] | (ORIGINAL DATA: DECIMAL NUMBERS) |
|---|---|---|---|
| CODING SCHEME | TOTAL NUMBER OF bits | bit PATTERN | |
| COMBINATION 17 | 104 | [0001, 0001, 00010000],<br>[0001, 0001, 100011111010],<br>[0001, 0010, 100010100000, 01111000],<br>[10010110, 0011, 00101101, 00110111, 1100010001111110] | |
| COMBINATION 18 | 92 | [0001, 0001, 00000001],<br>[0001, 0001, 00001111],<br>[0001, 0010, 00001010, 00000111],<br>[10010110, 0011, 00000010, 00000011, 01000111] | |
| COMBINATION 19 | 102 | [0001, 00, 00010000],<br>[0001, 00, 100011111010],<br>[0001, 01, 100010100000, 01111000],<br>[10010110, 1000, 00101101, 00110111, 1100010001111110] | |
| COMBINATION 20 | 86 | [0001, 00, 00000001],<br>[0001, 00, 00001111],<br>[0001, 01, 00001010, 00000111],<br>[10010110, 1000, 00000010, 00000011, 01000111] | |
| COMBINATION 21 | 102 | [00, 0001, 00010000],<br>[00, 0001, 100011111010],<br>[00, 0010, 100010100000, 01111000],<br>[11001111, 0011, 00101101, 00110111, 1100010001111110] | |
| COMBINATION 22 | 86 | [00, 0001, 00000001],<br>[00, 0001, 00001111],<br>[00, 0010, 00001010, 00000111],<br>[11001111, 0011, 00000010, 00000011, 01000111] | |
| COMBINATION 23 | 96 | [00, 00, 00010000],<br>[00, 00, 100011111010],<br>[00, 01, 100010100000, 01111000],<br>[11001111, 1000, 00101101, 00110111, 1100010001111110] | |
| COMBINATION 24 | 80 | [00, 00, 00000001],<br>[00, 00, 00001111],<br>[00, 01, 00001010, 00000111],<br>[11001111, 1000, 00000010, 00000011, 01000111] | |

FIG. 32

| DOG | 480 | [1,?,16], [1,?,250], [1,?,160,120], [22,?,45,55,1150] | (ORIGINAL DATA: DECIMAL NUMBERS) |
|---|---|---|---|

| CODING SCHEME | TOTAL NUMBER OF bits | bit PATTERN |
|---|---|---|
| COMBINATION 1 (4 bits) | 116 | [0001, 0010(2), 10010000],<br>[0001, 0011(3), 110011111010],<br>[0001, 0110(6), 110010100000, 110001111000],<br>[10010110, 10001000(8), 10101101, 10110111, 1110010001111110] |
| COMBINATION 2 (4 bits) | 80 | [0001, 0001(1), 0001],<br>[0001, 0010(2), 10001111],<br>[0001, 0011(3), 10001010, 0111],<br>[10010110, 0101(5), 0010, 0011, 110001000111] |
| COMBINATION 3 (2 bits) | 128 | [0001, 0100(4), 11001001],<br>[0001, 0110(6), 111011110011],<br>[0001, 10001100(12), 111010011001, 111001110001],<br>[10010110, 11001101(20), 111000100110, 111000110000, 1111010001110111] |
| COMBINATION 4 (2 bits) | 86 | [0001, 0001(1), 00],<br>[0001, 0100(4), 11001000],<br>[0001, 10001000(8), 11000011, 11000000],<br>[10010110, 10001000(8), 01, 10, 111001000000] |
| COMBINATION 5 (4 bits) | 114 | [0001, 01(2), 10010000],<br>[0001, 1000(3), 110011111010],<br>[0001, 1011(6), 110010100000, 110001111000],<br>[10010110, 11000001(8), 10101101, 10110111, 1110010001111110] |
| COMBINATION 6 (4 bits) | 76 | [0001, 00(1), 0001],<br>[0001, 01(2), 10001111],<br>[0001, 1000(3), 10001010, 0111],<br>[10010110, 1010(5), 0010, 0011, 110001000111] |
| COMBINATION 7 (2 bits) | 128 | [0001, 1001(4), 11001001],<br>[0001, 1011(6), 111011110011],<br>[0001, 11000101(12), 111010011001, 111001110001],<br>[10010110, 11001101(20), 111000100110, 111000110000, 1111010001110111] |
| COMBINATION 8 (2 bits) | 84 | [0001, 00(1), 00],<br>[0001, 1001(4), 11001000],<br>[0001, 11000001(8), 11000011, 11000000],<br>[10010110, 11000001(8), 01, 10, 111001000000] |

FIG. 33

| DOG | 480 | [1,?,16], [1,?,250], [1,?,160,120], [22,?,45,55,1150] | (ORIGINAL DATA: DECIMAL NUMBERS) |
|---|---|---|---|

| CODING SCHEME | TOTAL NUMBER OF bits | bit PATTERN |
|---|---|---|
| COMBINATION 9 (4 bits) | 110 | [00, 0010(2), 10010000],<br>[00, 0011(3), 110011111010],<br>[00, 0110(6), 110010100000, 110001111000],<br>[11001111, 10001000(8), 10101101, 10110111, 1110010001111110] |
| COMBINATION 10 (4 bits) | 74 | [00, 0001(1), 0001],<br>[00, 0010(2), 10001111],<br>[00, 0011(3), 10001010, 0111],<br>[11001111, 0101(5), 0010, 0011, 110001000111] |
| COMBINATION 11 (2 bits) | 122 | [00, 0100(4), 11001001],<br>[00, 0110(6), 111011110011],<br>[00, 10001100(12), 111010011001, 111001110001],<br>[11001111, 10010100(20), 111000100110, 111000110000, 1111010001110111] |
| COMBINATION 12 (2 bits) | 88 | [00, 0001(1), 00],<br>[00, 0100(4), 11001000],<br>[00, 10001000(8), 11000011, 11000000],<br>[11001111, 10001000(8), 01, 10, 111001000000] |
| COMBINATION 13 (4 bits) | 108 | [00, 01(2), 10010000],<br>[00, 1000(3), 110011111010],<br>[00, 1011(6), 110010100000, 110001111000],<br>[11001111, 11000001(8), 10101101, 10110111, 1110010001111110] |
| COMBINATION 14 (4 bits) | 70 | [00, 00(1), 0001],<br>[00, 01(2), 10001111],<br>[00, 1000(3), 10001010, 0111],<br>[11001111, 1010(5), 0010, 0011, 110001000111] |
| COMBINATION 15 (2 bits) | 122 | [00, 1001(4), 11001001],<br>[00, 1011(6), 111011110011],<br>[00, 11000101(12), 111010011001, 111001110001],<br>[11001111, 11001101(20), 111000100110, 111000110000, 1111010001110111] |
| COMBINATION 16 (2 bits) | 78 | [00, 00(1), 00],<br>[00, 1001(4), 11001000],<br>[00, 11000001(8), 11000011, 11000000],<br>[11001111, 11000001(8), 01, 10, 111001000000] |

FIG. 34

| DOG | 480 | [1,?,16], [1,?,250], [1,?,160,120], [22,?,45,55,1150] | (ORIGINAL DATA: DECIMAL NUMBERS) |
|---|---|---|---|

| CODING SCHEME | TOTAL NUMBER OF bits | bit PATTERN |
|---|---|---|
| COMBINATION 17 (4 bits) | 112 | [0001, 0010(2), 00010000],<br>[0001, 0011(3), 100011111010],<br>[0001, 0101(5), 100010100000, 01111000],<br>[10010110, 10001000(8), 00101101, 00110111, 1100010001111110] |
| COMBINATION 18 (4 bits) | 92 | [0001, 0010(2), 00000001],<br>[0001, 0010(2), 00001111],<br>[0001, 0100(4), 00001010, 00000111],<br>[10010110, 0110(6), 00000010, 00000011, 01000111] |
| COMBINATION 19 (4 bits) | 110 | [0001, 01(2), 00010000],<br>[0001, 1000(3), 100011111010],<br>[0001, 1010(5), 100010100000, 01111000],<br>[10010110, 11000001(8), 00101101, 00110111, 1100010001111110] |
| COMBINATION 20 (4 bits) | 88 | [0001, 01(2), 00000001],<br>[0001, 01(2), 00001111],<br>[0001, 1001(4), 00001010, 00000111],<br>[10010110, 1011(6), 00000010, 00000011, 01000111] |
| COMBINATION 21 (4 bits) | 106 | [00, 0010(2), 00010000],<br>[00, 0011(3), 100011111010],<br>[00, 0101(5), 100010100000, 01111000],<br>[11001111, 10001000(8), 00101101, 00110111, 1100010001111110] |
| COMBINATION 22 (4 bits) | 86 | [00, 0010(2), 00000001],<br>[00, 0010(2), 00001111],<br>[00, 0100(4), 00001010, 00000111],<br>[11001111, 0111(6), 00000010, 00000011, 01000111] |
| COMBINATION 23 (4 bits) | 104 | [00, 01(2), 00010000],<br>[00, 1000(3), 100011111010],<br>[00, 1010(5), 100010100000, 01111000],<br>[11001111, 11000001(8), 00101101, 00110111, 1100010001111110] |
| COMBINATION 24 (4 bits) | 82 | [00, 01(2), 00000001],<br>[00, 01(2), 00001111],<br>[00, 1001(4), 00001010, 00000111],<br>[11001111, 1011(6), 00000010, 00000011, 01000111] |

FIG. 35

| DOG | 480 | [1,1,?,16], [1,1,?,250], [1,2,?,160,120], [22,3,?,45,55,1150] (ORIGINAL DATA: DECIMAL NUMBERS) |
|---|---|---|
| CODING SCHEME | TOTAL NUMBER OF bits | bit PATTERN |
| COMBINATION 1 (4 bits) | 128 | [0001, 0001, 0010(2), 10010000],<br>[0001, 0001, 0011(3), 110011111010],<br>[0001, 0010, 0110(6), 110010100000, 110001111000],<br>[10010110, 0011, 10001000(8), 10101101, 10110111, 1110010001111110] |
| COMBINATION 2 (4 bits) | 92 | [0001, 0001, 0001(1), 0001],<br>[0001, 0001, 0010(2), 10001111],<br>[0001, 0010, 0011(3), 10001010, 0111],<br>[10010110, 0011, 0101(5), 0010, 0011, 110001000111] |
| COMBINATION 3 (2 bits) | 140 | [0001, 0001, 0100(4), 11001001],<br>[0001, 0001, 0110(6), 111011110011],<br>[0001, 0010, 10001100(12), 111010011001, 111001110001],<br>[10010110, 0011, 11001101(20), 111000100110, 111000110000, 1111010001110111] |
| COMBINATION 4 (2 bits) | 98 | [0001, 0001, 0001(1), 00],<br>[0001, 0001, 0100(4), 11001000],<br>[0001, 0010, 10001000(8), 11000011, 11000000],<br>[10010110, 0011, 10001000(8), 01, 10, 1110010000000] |
| COMBINATION 5 (4 bits) | 126 | [0001, 0001, 01(2), 10010000],<br>[0001, 0001, 1000(3), 110011111010],<br>[0001, 0010, 1011(6), 110010100000, 110001111000],<br>[10010110, 0011, 11000001(8), 10101101, 10110111, 1110010001111110] |
| COMBINATION 6 (4 bits) | 88 | [0001, 0001, 00(1), 0001],<br>[0001, 0001, 01(2), 10001111],<br>[0001, 0010, 1000(3), 10001010, 0111],<br>[10010110, 0011, 1010(5), 0010, 0011, 110001000111] |
| COMBINATION 7 (2 bits) | 140 | [0001, 0001, 1001(4), 11001001],<br>[0001, 0001, 1011(6), 111011110011],<br>[0001, 0010, 11000101(12), 111010011001, 111001110001],<br>[10010110, 0011, 11001101(20), 111000100110, 111000110000, 1111010001110111] |
| COMBINATION 8 (2 bits) | 96 | [0001, 0001, 00(1), 00],<br>[0001, 0001, 1001(4), 11001000],<br>[0001, 0010, 11000001(8), 11000011, 11000000],<br>[10010110, 0011, 11000001(8), 01, 10, 1110010000000] |

FIG. 36

| DOG | 480 | [1,1,?,16], [1,1,?,250], [1,2,?,160,120], [22,3,?,45,55,1150] (ORIGINAL DATA: DECIMAL NUMBERS) |
|---|---|---|
| CODING SCHEME | TOTAL NUMBER OF bits | bit PATTERN |
| COMBINATION 9 (4 bits) | 126 | [0001, 00, 0010(2), 10010000],<br>[0001, 00, 0011(3), 110011111010],<br>[0001, 01, 0110(6), 110010100000, 1100011110000],<br>[10010110, 1000, 10001000(8), 10101101, 10110111, 1110010001111110] |
| COMBINATION 10 (4 bits) | 90 | [0001, 00, 0001(1), 0001],<br>[0001, 00, 0010(2), 10001111],<br>[0001, 01, 0011(3), 10001010, 0111],<br>[10010110, 1000, 0101(5), 0010, 0011, 110001000111] |
| COMBINATION 11 (2 bits) | 138 | [0001, 00, 0100(4), 11001001],<br>[0001, 00, 0110(6), 111011110011],<br>[0001, 01, 10001100(12), 111010011001, 111001110001],<br>[10010110, 1000, 11001101(20), 111000100110, 111000110000, 1111010001110111] |
| COMBINATION 12 (2 bits) | 96 | [0001, 00, 0001(1), 00],<br>[0001, 00, 0100(4), 11001000],<br>[0001, 01, 10001000(8), 11000011, 11000000],<br>[10010110, 1000, 10001000(8), 01, 10, 111001000000] |
| COMBINATION 13 (4 bits) | 124 | [0001, 00, 01(2), 10010000],<br>[0001, 00, 1000(3), 110011111010],<br>[0001, 01, 1011(6), 110010100000, 1100011111000],<br>[10010110, 1000, 11000001(8), 10101101, 10110111, 1110010001111110] |
| COMBINATION 14 (4 bits) | 86 | [0001, 00, 00(1), 0001],<br>[0001, 00, 01(2), 10001111],<br>[0001, 01, 1000(3), 10001010, 0111],<br>[10010110, 1000, 1010(5), 0010, 0011, 110001000111] |
| COMBINATION 15 (2 bits) | 138 | [0001, 00, 1001(4), 11001001],<br>[0001, 00, 1011(6), 111011110011],<br>[0001, 01, 11000101(12), 111010011001, 111001110001],<br>[10010110, 1000, 11001101(20), 111000100110, 111000110000, 1111010001110111] |
| COMBINATION 16 (2 bits) | 94 | [0001, 00, 00(1), 00],<br>[0001, 00, 1001(4), 11001000],<br>[0001, 01, 11000001(8), 11000011, 11000000],<br>[10010110, 1000, 11000001(8), 01, 10, 111001000000] |

FIG. 37

| DOG | 480 | [1,1,?,16], [1,1,?,250], [1,2,?,160,120], [22,3,?,45,55,1150] (ORIGINAL DATA: DECIMAL NUMBERS) |
|---|---|---|
| CODING SCHEME | TOTAL NUMBER OF bits | bit PATTERN |
| COMBINATION 17 (4 bits) | 122 | [00, 0001, 0010(2), 10010000],<br>[00, 0001, 0011(3), 110011111010],<br>[00, 0010, 0110(6), 110010100000, 110001111000],<br>[11001111, 0011, 10001000(8), 10101101, 10110111, 1110010001111110] |
| COMBINATION 18 (4 bits) | 86 | [00, 0001, 0001(1), 0001],<br>[00, 0001, 0010(2), 10001111],<br>[00, 0010, 0011(3), 10001010, 0111],<br>[11001111, 0011, 0101(5), 0010, 0011, 110001000111] |
| COMBINATION 19 (2 bits) | 134 | [00, 0001, 0100(4), 11001001],<br>[00, 0001, 0110(6), 111011110011],<br>[00, 0010, 10001100(12), 111010011001, 111001110001],<br>[11001111, 0011, 10010100(20), 111000100110, 111000110000, 1111010001110111] |
| COMBINATION 20 (2 bits) | 100 | [00, 0001, 0001(1), 00],<br>[00, 0001, 0100(4), 11001000],<br>[00, 0010, 10001000(8), 11000011, 11000000],<br>[11001111, 0011, 10001000(8), 01, 10, 111001000000] |
| COMBINATION 21 (4 bits) | 120 | [00, 0001, 01(2), 10010000],<br>[00, 0001, 1000(3), 110011111010],<br>[00, 0010, 1011(6), 110010100000, 110001111000],<br>[11001111, 0011, 11000001(8), 10101101, 10110111, 1110010001111110] |
| COMBINATION 22 (4 bits) | 82 | [00, 0001, 00(1), 0001],<br>[00, 0001, 01(2), 10001111],<br>[00, 0010, 1000(3), 10001010, 0111],<br>[11001111, 0011, 1010(5), 0010, 0011, 110001000111] |
| COMBINATION 23 (2 bits) | 134 | [00, 0001, 1001(4), 11001001],<br>[00, 0001, 1011(6), 111011110011],<br>[00, 0010, 11000101(12), 111010011001, 111001110001],<br>[11001111, 0011, 11001101(20), 111000100110, 111000110000, 1111010001110111] |
| COMBINATION 24 (2 bits) | 90 | [00, 0001, 00(1), 00],<br>[00, 0001, 1001(4), 11001000],<br>[00, 0010, 11000001(8), 11000011, 11000000],<br>[11001111, 0011, 11000001(8), 01, 10, 111001000000] |

FIG. 38

| DOG | 480 | [1,1,?,16], [1,1,?,250], [1,2,?,160,120], [22,3,?,45,55,1150] (ORIGINAL DATA: DECIMAL NUMBERS) |
|---|---|---|
| CODING SCHEME | TOTAL NUMBER OF bits | bit PATTERN |
| COMBINATION 25 (4 bits) | 120 | [00, 00, 0010(2), 10010000],<br>[00, 00, 0011(3), 110011111010],<br>[00, 01, 0110(6), 110010100000, 110001111000],<br>[11001111, 1000, 10001000(8), 10101101, 10110111, 1110010001111110] |
| COMBINATION 26 (4 bits) | 84 | [00, 00, 0001(1), 0001],<br>[00, 00, 0010(2), 10001111],<br>[00, 01, 0011(3), 10001010, 0111],<br>[11001111, 1000, 0101(5), 0010, 0011, 110001000111] |
| COMBINATION 27 (2 bits) | 132 | [00, 00, 0100(4), 11001001],<br>[00, 00, 0110(6), 111011110011],<br>[00, 01, 10001100(12), 111010011001, 111001110001],<br>[11001111, 1000, 10010100(20), 111000100110, 111000110000, 1111010001110111] |
| COMBINATION 28 (2 bits) | 98 | [00, 00, 0001(1), 00],<br>[00, 00, 0100(4), 11001000],<br>[00, 01, 10001000(8), 11000011, 11000000],<br>[11001111, 1000, 10001000(8), 01, 10, 111001000000] |
| COMBINATION 29 (4 bits) | 118 | [00, 00, 01(2), 10010000],<br>[00, 00, 1000(3), 110011111010],<br>[00, 01, 1011(6), 110010100000, 110001111000],<br>[11001111, 1000, 11000001(8), 10101101, 10110111, 1110010001111110] |
| COMBINATION 30 (4 bits) | 80 | [00, 00, 00(1), 0001],<br>[00, 00, 01(2), 10001111],<br>[00, 01, 1000(3), 10001010, 0111],<br>[11001111, 1000, 1010(5), 0010, 0011, 110001000111] |
| COMBINATION 31 (2 bits) | 132 | [00, 00, 1001(4), 11001001],<br>[00, 00, 1011(6), 111011110011],<br>[00, 01, 11000101(12), 111010011001, 111001110001],<br>[11001111, 1000, 11001101(20), 111000100110, 111000110000, 1111010001110111] |
| COMBINATION 32 (2 bits) | 88 | [00, 00, 00(1), 00],<br>[00, 00, 1001(4), 11001000],<br>[00, 01, 11000001(8), 11000011, 11000000],<br>[11001111, 1000, 11000001(8), 01, 10, 111001000000] |

FIG. 39

| DOG | 480 | [1,1,?,16], [1,1,?,250], [1,2,?,160,120], [22,3,?,45,55,1150] (ORIGINAL DATA: DECIMAL NUMBERS) |
|---|---|---|
| CODING SCHEME | TOTAL NUMBER OF bits | bit PATTERN |
| COMBINATION 33 (4 bits) | 124 | [0001, 0001, 0010(2), 00010000],<br>[0001, 0001, 0011(3), 100011111010],<br>[0001, 0010, 0101(5), 100010100000, 01111000],<br>[10010110, 0011, 10001000(8), 00101101, 00110111, 1100010001111110] |
| COMBINATION 34 (4 bits) | 104 | [0001, 0001, 0010(2), 00000001],<br>[0001, 0001, 0010(2), 00001111],<br>[0001, 0010, 0100(4), 00001010, 00000111],<br>[10010110, 0011, 0111(6), 00000010, 00000011, 01000111] |
| COMBINATION 35 (4 bits) | 122 | [0001, 0001, 01(2), 00010000],<br>[0001, 0001, 1000(3), 100011111010],<br>[0001, 0010, 1010(5), 100010100000, 01111000],<br>[10010110, 0011, 11000001(8), 00101101, 00110111, 1100010001111110] |
| COMBINATION 36 (4 bits) | 100 | [0001, 0001, 01(2), 00000001],<br>[0001, 0001, 01(2), 00000111],<br>[0001, 0010, 1001(4), 00001010, 01000111],<br>[10010110, 0011, 1011(6), 00000010, 00000011, 01000111] |
| COMBINATION 37 (4 bits) | 122 | [0001, 00, 0010(2), 00010000],<br>[0001, 00, 0011(3), 100011111010],<br>[0001, 01, 0101(5), 100010100000, 01111000],<br>[10010110, 1000, 10001000(8), 00101101, 00110111, 1100010001111110] |
| COMBINATION 38 (4 bits) | 102 | [0001, 00, 0010(2), 00000001],<br>[0001, 00, 0010(2), 00001111],<br>[0001, 01, 0100(4), 00001010, 00000111],<br>[10010110, 1000, 0111(6), 00000010, 00000011, 01000111] |
| COMBINATION 39 (4 bits) | 120 | [0001, 00, 01(2), 00010000],<br>[0001, 00, 1000(3), 100011111010],<br>[0001, 01, 1010(5), 100010100000, 01111000],<br>[10010110, 1000, 11000001(8), 00101101, 00110111, 1100010001111110] |
| COMBINATION 40 (4 bits) | 98 | [0001, 00, 01(2), 00000001],<br>[0001, 00, 01(2), 00001111],<br>[0001, 01, 1001(4), 00001010, 00000111],<br>[10010110, 1000, 1011(6), 00000010, 00000011, 01000111] |

FIG. 40

| DOG | 480 | [1, 1, ?, 16], [1, 1, ?, 250], [1, 2, ?, 160, 120], [22, 3, ?, 45, 55, 1150] (ORIGINAL DATA : DECIMAL NUMBERS) |
|---|---|---|
| CODING SCHEME | TOTAL NUMBER OF bits | bit PATTERN |
| COMBINA-TION 41 (4 bits) | 118 | [00, 0001, 0010(2), 00010000],<br>[00, 0001, 0011(3), 100011110100],<br>[00, 0010, 0101(5), 100010100000, 01111000],<br>[11001111, 0011, 10001000(8), 00101101, 00110111, 1100010001111110] |
| COMBINA-TION 42 (4 bits) | 98 | [00, 0001, 0010(2), 00000001],<br>[00, 0001, 0010(2), 00001111],<br>[00, 0010, 0100(4), 00001010, 00000111],<br>[11001111, 0011, 0111(6), 00000010, 00000011, 01000111] |
| COMBINA-TION 43 (4 bits) | 116 | [00, 0001, 01(2), 00010000],<br>[00, 0001, 1000(3), 100011110100],<br>[00, 0010, 1010(5), 100010100000, 01111000],<br>[11001111, 0011, 11000001(8), 00101101, 00110111, 1100010001111110] |
| COMBINA-TION 44 (4 bits) | 94 | [00, 0001, 01(2), 00000001],<br>[00, 0001, 01(2), 00001111],<br>[00, 0010, 1001(4), 00001010, 00000111],<br>[11001111, 0011, 1011(6), 00000010, 00000011, 01000111] |
| COMBINA-TION 45 (4 bits) | 116 | [00, 00, 0010(2), 00010000],<br>[00, 00, 0011(3), 100011110100],<br>[00, 01, 0101(5), 100010100000, 01111000],<br>[11001111, 1000, 10001000(8), 00101101, 00110111, 1100010001111110] |
| COMBINA-TION 46 (4 bits) | 96 | [00, 00, 0010(2), 00000001],<br>[00, 00, 0010(2), 00001111],<br>[00, 01, 0100(4), 00001010, 0111],<br>[11001111, 1000, 0111(6), 00000010, 00000011, 01000111] |
| COMBINA-TION 47 (4 bits) | 114 | [00, 00, 01(2), 00010000],<br>[00, 00, 1000(3), 100011110100],<br>[00, 01, 1010(5), 100010100000, 01111000],<br>[11001111, 1000, 11000001(8), 00101101, 00110111, 1100010001111110] |
| COMBINA-TION 48 (4 bits) | 92 | [00, 00, 01(2), 00000001],<br>[00, 00, 01(2), 00001111],<br>[00, 01, 1001(4), 00001010, 00000111],<br>[11001111, 1000, 1011(6), 00000010, 00000011, 01000111] |

FIG. 41

APPARATUS AND METHOD FOR DATA COMPRESSION/EXPANSION USING BLOCK-BASED CODING WITH TOP FLAG

FIELD OF THE INVENTION

The present invention relates to a data compression apparatus and method wherein any data is encoded and then compressed, and a data expansion apparatus and method wherein compressed data is expanded.

DESCRIPTION OF THE RELATED ART

In an information retrieval system such as a full-text retrieval system or a ranking retrieval system, it is important to heighten the creation rate of indices for use in retrieval and to suppress the size of the indices. Here, the "full-text retrieval system" indicates a system wherein documents containing a character string (a keyword) designated by a user are retrieved with subjects being the full texts of documents stored in a document DB (database), while the "ranking retrieval system" indicates a system wherein documents being highly relevant to a designated character string are retrieved.

The "index" in such an information retrieval system has a data structure wherein the information of document No., the number of occurrences of the word within the corresponding document, the occurring positions of the word within the document, or the like, is affixed to the key for the retrieval. By way of example, a keyword "dog" and the sets [Document No., Number of Occurrences of Word within Document] of documents containing the keyword are represented as illustrated in FIG. 1 of the accompanying diagrams.

The index exemplified in FIG. 1 signifies that the key "dog" occurs once in document No. 1, once in document No. 2, twice in document No. 3 and three times in document No. 25.

In this example, assuming that one item of numerical data be expressed by 32 bits (4 bytes), the index to the key "dog" requires an area of 256 bits (=32 bits*8) for its expression because it contains 8 numerical values. When the storage areas of only document Nos. based on this method are calculated for documents in Gbyte units by way of example, they become gigantic relative to the size of originals as listed in FIG. 2. Therefore, the index sizes need to be compressed.

The fundamental principle of the compression of the index size is that each numerical value is not expressed by a predetermined number of bits (usually, 32 bits), but that it is expressed by the smallest possible number of bits. As will be explained later, existent coding schemes express small numerical values with small numbers of bits and large numerical values with large numbers of bits.

As the first stage of the index size compression, it is desirable that the numerical values contained in the index are made as small as possible. This expedient can be realized by taking the differences between the respectively two consecutive data items as to the "document Nos." or the "occurring positions of the word within the documents". Since the document Nos. and the occurring positions of the word within the documents are successively arrayed from ones of smaller numerical value toward ones of larger numerical value, the numerical values to be expressed can be made smaller by taking the differences between the respectively adjacent numerical values.

For example, the differences taken between the respectively adjacent document Nos. for the index shown in FIG. 1 are as indicated in FIG. 3. The document No. "1" in the first data set [1, 1] shown in FIG. 3 denotes the actual document No. itself, while the document No. "1" in the second data set [1, 1] denotes the different value between the document No. "1" in the first data set and the actual document No. "2" in the second data set. Here, the "actual document No." signifies the document No. assigned before taking the difference as indicated in FIG. 1.

The document No. "1" in the third data set [1, 2] denotes the different value between the actual document No. "2" in the second data set and the actual document No. "3" in the third data set, while the document No. "22" in the fourth data set [22, 3] denotes the different value between the actual document No. "3" in the third data set and the actual document No. "25" in the fourth data set.

Known as coding schemes for such numerical data are 8-bit block (8BB) coding, 4-bit block (4BB) coding, unary coding, $\gamma$-coding, $\delta$-coding, etc. In any of these coding schemes, a smaller numerical value is expressed by a smaller number of bits, and a larger numerical value by a larger number of bits.

More specifically, the "8-bit block coding" is a method wherein the first one bit (top bit) in each block formed of 8 bits (1 byte) is set as a continuation flag and wherein the next block is deemed to succeed when the flag is ON. Several examples of numerical values are mentioned below:

| Number to be Denoted | Bits |
| --- | --- |
| 1 | 00000001 |
| 2 | 00000010 |
| 3 | 00000011 |
| 128 | 10000001 00000000 |
| 129 | 10000001 00000001 |

Here, in case of the numerical value 1, 2 or 3, the succeeding block does not exist, and hence, the top bit is "0". To the contrary, in the case of the numerical value 128 or 129, the second block exists, and hence, the top bit is "1". With this method, the minimum number of bits and the maximum number of bits of codes denoting numerical values each of which is expressed by one word (32 bits) become 8 bits and 40 bits, respectively.

In addition, the "4-bit block coding" is a method wherein the first one bit in each block formed of 4 bits is set as a continuation flag and wherein the next block is deemed to succeed when the flag is ON. Several examples of numerical values are mentioned below:

| Number to be Denoted | Bits |
| --- | --- |
| 1 | 0001 |
| 2 | 0010 |
| 3 | 0011 |
| 4 | 0100 |
| 5 | 0101 |
| 6 | 0110 |
| 7 | 0111 |
| 8 | 1001 0000 |
| 9 | 1001 0001 |
| 128 | 1010 1000 0000 |
| 129 | 1010 1000 0001 |

Here, in the case of the numerical value 1, 2, 3, 4, 5, 6 or 7, the succeeding block does not exist, and hence, the top bit is "0". To the contrary, in the case of the numerical value 8 or 9, the second block exists, and hence, the top bit is "1". Moreover, in the case of the numerical value 128 or 129, the third block exists, and hence, the top bit of each of the first and second blocks is "1". With this method, the minimum number of bits and the maximum number of bits of codes denoting numerical values, each of which is expressed by one word, become 4 bits and 44 bits, respectively.

"Unary coding" is a method wherein a number "n" is expressed by [the consecution of "1"s numbering (n−1)+ "0"]. This method will be used chiefly for explaining the γ-coding and δ-coding later. Several examples of numerical values are mentioned below:

| Number to be Denoted | Bits |
|---|---|
| 1 | 0 |
| 2 | 10 |
| 3 | 110 |
| 4 | 1110 |
| 5 | 11110 |
| 6 | 111110 |
| 128 | 11111···(consecution of "1"s numbering 127)···0 |
| 129 | 11111···(consecution of "1"s numbering 128)···0 |

With this method, the minimum number of bits and the maximum number of bits of codes denoting numerical values, each of which is expressed by one word, become 1 bit and 4294967295 ($=2^{32}-1$) bits, respectively.

Further, in the γ-coding, the code of a number "x" is expressed by dividing it into a prefix part and a suffix part. Here, the maximum one of integers which are not greater than a value $\log_2 x$ shall be written as $I1(x)=$Out1.

$\lfloor \log_2 x \rfloor$

Then, the prefix part is obtained by expressing a number $(1+I1(x))$ in accordance with the unary coding, while the suffix part is obtained by expressing a value $(x-2^{I1(x)})$ in terms of a binary number composed of $I1(x)$ bits. Several examples of numerical values are mentioned below:

| Number to be Denoted | Prefix part | Suffix part |
|---|---|---|
| 1 | 0 ("0" is expressed with (1 + 0) bit) | None ("1 − $2^{0}$" is expressed with 0 bit) |
| 2 | 10 ("1" is expressed with (1 + 1) bits) | 0 ("2 − $2^{1}$" is expressed with 1 bit) |
| 3 | 10 ("1" is expressed with (1 + 1) bits) | 1 ("3 − $2^{1}$" is expressed with 1 bit) |
| 4 | 110 ("2" is expressed with (1 + 2) bits) | 00 ("4 − $2^{2}$" is expressed with 2 bits) |
| 5 | 110 ("2" is expressed with (1 + 2) bits) | 01 ("5 − $2^{2}$" expressed with 2 bits) |
| 6 | 110 ("2" is expressed with (1 + 2) bits) | 10 ("6 − $2^{2}$" is expressed with 2 bits) |
| 7 | 110 ("2" is expressed with (1 + 2) bits) | 11 ("7 − $2^{2}$" is expressed with 2 bits) |
| 8 | 1110 ("3" is expressed with (1 + 3) bits) | 000 ("8 − $2^{3}$" is expressed with 3 bits) |
| 9 | 1110 ("3" is expressed with (1 + 3) bits) | 001 ("9 − $2^{3}$" is expressed with 3 bits) |
| 10 | 1110 ("3" is expressed with (1 + 3) bits) | 010 ("10 − $2^{3}$" is expressed with 3 bits) |
| 128 | 11111110 ("7" is expressed with (1 + 7) bits) | 0000000 ("128 − $2^{7}$" is expressed with 7 bits) |
| 129 | 11111110 ("7" is expressed with (1 + 7) bits) | 0000001 ("129 − $2^{7}$" is expressed with 7 bits) |

By way of example, in case of the numerical value 129, the code '11111110' of the prefix part consists of 8 bits, and it contains seven consecutive "1"s. This indicates I(129)=7 which signifies that the suffix part of the numerical value 129 consists of 7 bits. Besides, the suffix part '0000001' expresses "129−$2^{7}$" with the 7 bits. With this method, the minimum number of bits and the maximum number of bits of codes denoting numerical values, each of which is expressed by one word, become 1 bit and 63 bits (=1+31+31 bits), respectively.

Also in the δ-coding, in the same manner as in the γ-coding, the code of a number "x" is expressed by dividing it into a prefix part and a suffix part. The prefix part is obtained by expressing a number $(1+I1(x))$ in accordance with the γ-coding, while the suffix part is obtained by expressing a value $(x-2^{I1(x)})$ in terms of a binary number composed of $I1(x)$ bits, as in the γ-coding. Several examples of numerical values are mentioned below:

| Number to be Denoted | Prefix part | Suffix part |
|---|---|---|
| 1 | 0 (γ-coding of "1") | None ("1 − $2^{0}$" is expressed with 0 bit) |
| 2 | 100 (γ-coding of "2") | 0 ("2 − $2^{1}$" is expressed with 1 bit) |
| 3 | 100 (γ-coding of "3") | 1 ("3 − $2^{1}$" is expressed with 1 bit) |
| 4 | 101 (γ-coding of "3") | 00 ("4 − $2^{2}$" is expressed with 2 bits) |
| 5 | 101 (γ-coding of "3") | 01 ("5 − $2^{2}$" is expressed with 2 bits) |
| 6 | 101 (γ-coding of "3") | 10 ("6 − $2^{2}$" is expressed with 2 bits) |
| 7 | 101 (γ-coding of "3") | 11 ("7 − $2^{2}$" is expressed with 2 bits) |
| 8 | 11000 (γ-coding of "4") | 000 ("8 − $2^{3}$" is expressed with 3 bits) |
| 9 | 11000 (γ-coding of "4") | 001 ("9 − $2^{3}$" is expressed with 3 bits) |
| 10 | 11000 (γ-coding of "4") | 010 ("10 − $2^{3}$" is expressed with 3 bits) |
| 128 | 1110000 (γ-coding of "8") | 0000000 ("128 − $2^{7}$" is expressed with 7 bits) |
| 129 | 1110000 (γ-coding of "8") | 0000001 ("129 − $2^{7}$" is expressed with 7 bits) |

With this method, the minimum number of bits and the maximum number of bits of codes denoting numerical values, each of which is expressed by one word, become 1 bit and 42 bits (=(5+1+5)+31 bits), respectively.

The above coding schemes in the prior art have problems as stated below.

By way of example, in cases where the index structure, shown in FIG. 3, is represented using these coding schemes, the necessary numbers of bits are as listed in FIG. 4. In the figure, only the original data items before being encoded are described by decimal values, and index structures after the encoding operations are described using the numbers of bits required for expressing the original data. It is seen from FIG. 4 that 32-bit coding without compression requires the largest number of bits, and that the δ-coding can describe the index structure with the smallest number of bits.

In general, with the block-based coding scheme such as 8-bit block coding or 4-bit block coding, any numerical value inevitably requires the number of bits correspondent to one block, no matter how small it may be. In this regard, small numerical values such as "1" and "2" account for most data in the index structure employing the different values as shown in FIG. 3. Therefore, the block-based coding scheme has the problem that the index size is not considerably reduced. Another problem is that, since the step of affixing the continuation flag to the top of each block is necessitated, a long time is spent on an index creation process.

On the other hand, with the bit-based coding scheme such as unary coding, γ-coding or δ-coding, the small numerical values of "1", "2" etc., can be expressed with smaller numbers of bits than in the block-based coding. However, as the numerical values of data enlarge, the required number of bits tend to become much larger than in the block-based coding. Therefore, the bit-based coding scheme cannot always ensure reduction in the index size. Another problem is that, due to a complicated algorithm, long time periods are expended on both an index creation process and a decoding process.

SUMMARY OF THE INVENTION

An object of the present invention is to provide a data compression apparatus and method and a data expansion apparatus and method which can raise the rate of an index creation process and can suppress the size of indices without lowering the rate of a decoding process for numerical data.

In one aspect of performance of the present invention, a data compression apparatus comprises a compression unit and a storage unit, while a data expansion apparatus comprises the storage unit and an expansion unit.

The compression unit compresses given data in block units, and generates continuation flag information expressive of the length of compressed data at the top part of the compressed data.

The storage unit stores the compressed data therein.

The expansion unit determines the length of the compressed data on the basis of the continuation flag information at the top part of the data compressed in block units, and restores the original data.

In a case where the original data has a binary bit pattern, ordinarily the compressibility thereof becomes lower as a numerical value to be denoted by the data is larger, and it becomes higher as the numerical value is smaller. The compression unit determines the block length of the data compressed in accordance with the value of the original data, and generates the corresponding continuation flag information. It operates to store the generated continuation flag information at the top part of the compressed data and to store data expressive of the original data in succession to the continuation flag information.

When the numerical value is comparatively small, the compressed data is expressed by a bit pattern shorter than that of the original data. Incidentally, the continuation flag information may well express the block length of the remaining part obtained by removing the continuation flag information itself from the compressed data.

According to such a compression process, affixing the continuation flags at the tops of the respective blocks one by one, as in the block-based coding in the prior art, is dispensed with, and a process for creating the continuation flag information can be finished at one time. Consequently, a process for creating the compressed data is expedited, and an index creation process can be expedited by utilizing the compressed-data creation process.

Moreover, the length of the top block of the compressed data can be varied in accordance with the value of the original data, and the compressibility of the compressed data is enhanced by shortening this length in the case of a small numerical value. The enhanced compressibility leads to reduction in an index size for the reason that small values such as "1" and "2" appear in large numbers among numerical data for use in indices.

The expansion unit derives the continuation flag information from the top part of the compressed data, and determines the block length of the compressed data on the basis of the derived continuation flag information. Subsequently, the expansion unit calculates the block length of the remaining part of the compressed data by subtracting the block length of the continuation flag information from the determined block length of the whole compressed data, and it fetches the remaining part. Then, the expansion unit generates the original data from the fetched data.

In the case where the continuation flag information expresses the block length of the remaining data, the remaining data can be fetched using this information as it is.

According to such an expansion process, deriving the continuation flags from the tops of the respective blocks one by one, as in the block-based decoding in the prior art, is dispensed with, and the derivation of the continuation flag information can be finished at one time. Consequently, a process for creating the original data is expedited in the case of a comparatively large numerical value.

Further, as compared with those of the bit-based coding in the prior art, the compression process and the expansion process are simpler and suffice with shorter processing time periods. Besides, the compressibility of a large numerical value is considered to become higher.

According to the present invention, it is possible to expedite the index creation process and to heighten the compressibilities of indices, without lowering the speed of the process for decoding numerical data.

In particular, a time period required for index creation can be shortened by advanced 4BB coding, and the compressibilities of indices can be heightened without considerably lowering the speeds of the encoding/decoding processes, by B24 coding and 84BB coding. Besides, the compressibilities of indices can be heightened by Per coding, though the precision of information degrades to some extent.

BRIEF DESCRIPTION OF THE DRAWINGS

FIG. 1 is a diagram showing a key and an index structure;

FIG. 2 is a diagram showing the sizes of uncompressed indices;

FIG. 3 is a diagram showing an index structure which utilizes differences;

FIG. 4 is a diagram showing encoded examples of difference values;

FIG. 5 is a diagram for elucidating the principles of data compression/expansion apparatuses according to the present invention;

FIG. 8 is a diagram exemplifying the program of 4BB coding;

FIG. 10 is a diagram exemplifying the program of 4BB decoding;

FIG. 12 is a diagram exemplifying the program of advanced 4BB coding;

FIG. 14 is a diagram exemplifying the program of advanced 4BB decoding;

FIG. 16 is a diagram exemplifying the program of 84BB coding;

FIG. 18 is a diagram exemplifying the program of 84BB decoding;

FIG. 20 is a diagram exemplifying the program of B24 coding;

FIG. 22 is a diagram exemplifying the program of B24 decoding;

FIG. 23 is a diagram showing the numbers of bits necessary for numerical expressions;

FIG. 24 is a diagram showing encoded examples of the maximum number of 32 bits;

FIG. 27 is a diagram showing an example of a fifth index structure;

FIG. 28 is a diagram showing the bit patterns of a first index structure;

FIG. 29 is a diagram showing the bit patterns of a second index structure;

FIG. 30 is a diagram (#1) showing the bit patterns of a third index structure;

FIG. 31 is a diagram (#2) showing the bit patterns of the third index structure;

FIG. 32 is a diagram (#3) showing the bit patterns of the third index structure;

FIG. 33 is a diagram (#1) showing the bit patterns of a fourth index structure;

FIG. 34 is a diagram (#2) showing the bit patterns of the fourth index structure;

FIG. 35 is a diagram (#3) showing the bit patterns of the fourth index structure;

FIG. 36 is a diagram (#1) showing the bit patterns of a fifth index structure;

FIG. 37 is a diagram (#2) showing the bit patterns of the fifth index structure;

FIG. 38 is a diagram (#3) showing the bit patterns of the fifth index structure;

FIG. 39 is a diagram (#4) showing the bit patterns of the fifth index structure;

FIG. 40 is a diagram (#5) showing the bit patterns of the fifth index structure; and FIG. 41 is a diagram (#6) showing the bit patterns of the fifth index structure.

DESCRIPTION OF THE PREFERRED EMBODIMENTS

Figure 6:
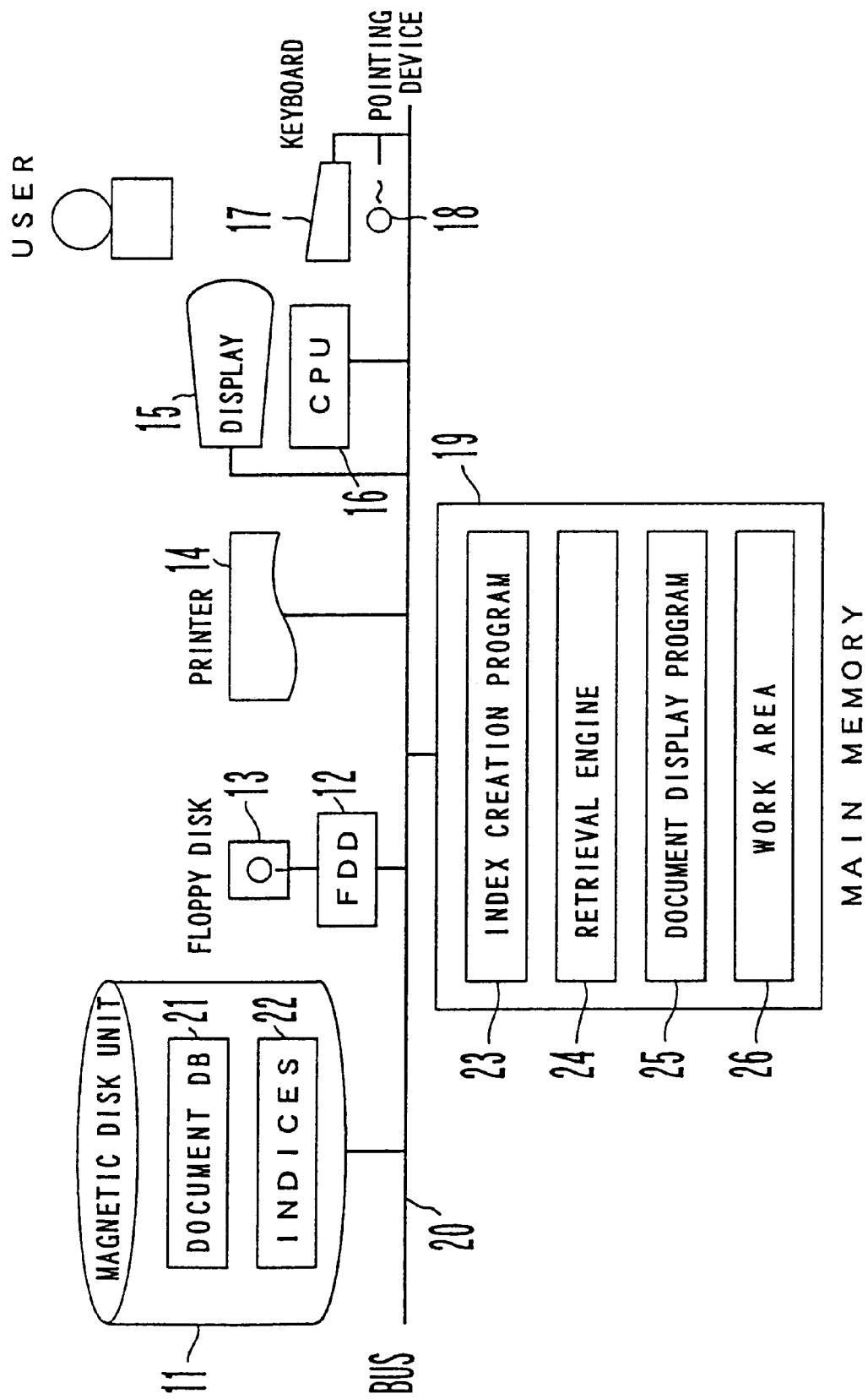
FIG. 6 is a block diagram showing an information retrieval system.

Now, the aspects of performance of the present invention will be described in detail with reference to the drawings.

FIG. 5 is a diagram for elucidating the principles of a data compression apparatus and a data expansion apparatus according to the present invention. The data compression apparatus shown in FIG. 5 comprises a compression unit 1 and a storage unit 2, while the data expansion apparatus comprises the storage unit 2 and an expansion unit 3.

The compression unit 1 compresses given data 4 in block units, and generates continuation flag information expressive of the length of compressed data 5 at the top part of the compressed data 5.

The storage unit 2 stores the compressed data 5 therein.

The expansion unit 3 determines the length of the compressed data 5 on the basis of the continuation flag information at the top part of the data 5 compressed in block units, and restores the original data 4.

In a case where the original data 4 has a binary bit pattern, ordinarily the compressibility thereof becomes lower as a numerical value, to be denoted by the data 4, is larger, and it becomes higher as the numerical value is smaller. The compression unit 1 determines the block length of the data 5 compressed in accordance with the value of the original data 4, and generates the corresponding continuation flag information. Besides, it operates to store the generated continuation flag information at the top part of the data 5 and to store data expressive of the data 4 in succession to the continuation flag information.

When the numerical value is comparatively small, the compressed data 5 is expressed by a bit pattern shorter than that of the original data 4. Incidentally, the continuation flag information may well express the block length of the remaining part obtained by removing the continuation flag information itself from the data 5.

According to such a compression process, affixing the continuation flags at the tops of the respective blocks one by one, as in the block-based coding in the prior art, is dispensed with, and a process for creating the continuation flag information can be finished at one time. Consequently, a process for creating the compressed data 5 is expedited, and an index creation process can be expedited by utilizing the compressed-data creation process.

Moreover, the length of the top block of the compressed data 5 can be varied in accordance with the value of the original data 4, and the compressibility of the data 5 is enhanced by shortening this length in the case of a small numerical value. The enhanced compressibility leads to reduction in an index size for the reason that small values such as "1" and "2" appear in large numbers among numerical data for use in indices.

The expansion unit 3 derives the continuation flag information from the top part of the compressed data 5, and determines the block length of the data 5 on the basis of the derived continuation flag information. Subsequently, the expansion unit 3 calculates the block length of the remaining part of the data 5 by subtracting the block length of the continuation flag information from the determined block length of the whole compressed data, and it fetches the remaining data. Besides, the expansion unit 3 generates the original data 4 from the fetched data. In the case where the continuation flag information expresses the block length of the remaining data, the remaining data can be fetched using this information as it is.

According to such an expansion process, deriving the continuation flags from the tops of the respective blocks one by one, as in the block-based decoding in the prior art, is dispensed with, and the derivation of the continuation flag information can be finished at one time. Consequently, a process for creating the original data 4 is expedited in the case of a comparatively large numerical value.

Further, as compared with those of the bit-based coding in the prior art, the compression process and the expansion process are simpler and suffice with shorter processing time periods. Also, the compressibility of a large numerical value is considered to become higher.

By way of example, the compression unit 1 and the expansion unit 3 in FIG. 5 correspond to a CPU (central processing unit) 16 and a main memory 19 in FIG. 6 to be explained later, and the storage unit 2 corresponds to the main memory 19 or a magnetic disk unit 11.

In the present invention, the three types of block-based encoding methods of advanced 4-bit block (4BB) coding, 8/4-bit block (84BB) coding and block-24 (B24) coding are proposed as new encoding methods. First, these encoding methods shall be respectively outlined.

The advanced 4BB coding consists basically in improvements on the 4BB coding explained before. In the conventional 4BB coding, one top bit among 4 bits is set as the continuation flag "1", and the next 4 bits are deemed to have a number when the flag is ON. In contrast, an advanced 4BB code has a structure in which all the continuation flags are collectively borne at the top bits of the code. In addition, a bit pattern behind a first occurring "0" is regarded as a numerical part. Several examples of numerical values in the advanced 4BB coding are mentioned below:

| Number to be Denoted | Bits |
| --- | --- |
| 1 | 0001 |
| 2 | 0010 |
| 3 | 0011 |
| 4 | 0100 |
| 5 | 0101 |
| 6 | 0110 |
| 7 | 0111 |
| 8 | 1000 1000 |
| 9 | 1000 1001 |
| 128 | 1100 1000 0000 |
| 129 | 1100 1000 0001 |

Here, in the case of the numerical value 1, 2, 3, 4, 5, 6 or 7, the succeeding block does not exist, and hence, the top bit is "0". To the contrary, in the case of the numerical value 8 or 9, the second block exists, and hence, the top bit of the first block is "1". Besides, in the case of the numerical value 128 or 129, the third block is also existent, and hence, the first and second bits of the first block are "1"s. The LSB (least significant bit) of the bit pattern of the numerical value succeeding the continuation flag or flags comes to the right end of the last block in any case.

With this method, the minimum number of bits and the maximum number of bits of codes denoting numerical values, each of which is expressed by one word, become 4 bits and 44 bits, respectively. Accordingly, the compression efficiency of this method is, in itself, equivalent to that of the 4BB coding. However, the number of steps in an encoding process becomes smaller than in the 4BB coding. Therefore, in such a case where indices are created for a large-scale database (DB), the rate of an index creation process can be expected to rise considerably.

As regards decoding, with the 4BB coding, processing loops are iterated while the continuation flags are being decided one by one, and with the advanced 4BB coding, the continuation flags are decoded beforehand, and the numerical value is thereafter obtained collectively or as a whole. In spite of such a difference, the processing rates of the decoding do not differ so conspicuously as in the encoding between both the coding schemes. In the case of a large numerical value, however, the processing rate of the advanced 4BB code is higher than that of the 4BB code.

Next, the 84BB (8/4-bit block) coding, similar to the advanced 4BB coding, will be explained. Whereas block lengths in the advanced 4BB coding are kept constant at 4 bits for any numerical value, the 84BB coding affords 8 bits to only the first one block and 4 bits to each block succeeding the first block in accordance with a continuation flag. According to this method, a numerical value of at most 127 is expressed by "0" of one bit and the bit pattern of the numerical value composed of 7 bits, and a numerical value of at least 128 is expressed by one or more continuation flags and the bit pattern of the numerical value. Several examples of numerical values are mentioned below:

| Number to be Denoted | Bits |
| --- | --- |
| 1 | 00000001 |
| 2 | 00000010 |
| 3 | 00000011 |
| 4 | 00000100 |
| 5 | 00000101 |
| 6 | 00000110 |
| 7 | 00000111 |
| 8 | 00001000 |
| 9 | 00001001 |
| 127 | 01111111 |
| 128 | 10001000 0000 |
| 129 | 10001000 0001 |

Here, in case of the numerical value 1, 2, 3, 4, 5, 6, 7, 8, 9 or 127, the succeeding block does not exist, and hence, the top bit is "0". To the contrary, in the case of the numerical value 128 or 129, the second block exists, and hence, the top bit of the first block is "1". With this method, the minimum number of bits and the maximum number of bits of codes denoting numerical values, each of which is expressed by one word, become 8 bits and 44 bits respectively.

By way of example, a numerical value, which is handled as the "occurring position of a word within a document" in an index, becomes considerably large as compared with a "document No. (in terms of a difference value)" or the "number of occurrences of the word within the document". Even with a difference value, therefore, the numerical value of the "occurring position" cannot be satisfactorily compressed by any of the conventional numerical-data encoding methods.

When compared with the 4BB coding or the advanced 4BB coding, the 84BB coding can express a numerical value larger to the amount of one bit, by the use of the first 8 bits. Thus, the 84BB coding can express a numerical value of medium magnitude with a smaller number of bits than in the other coding scheme. It can accordingly be said that the 84BB coding is suited to encode the "occurring positions of the word within the document".

Next, the B24 (block-24) coding is a method in which each of numerical values "1" and "2" is encoded with 2 bits, each of numerical values "3" through "6" is encoded with 4 bits, and each of numerical values of at least "7" is encoded by the advanced 4BB coding. Herein, each of the numerical values "1" and "2" is expressed by a 2-bit code, the first one bit of which is set as a continuation flag "0", while each of the numerical values "3" through "6" is expressed by a 4-bit code the first 2 bits are set as a continuation flag "10". Encoding any larger numerical values is similar to the process of the advanced 4BB coding.

Further, in the advanced 4BB coding, the numerical value which succeeds the continuation flag will be left intact, whereas in the B24 coding, a value obtained by subtracting "1" is used as the successional numerical value for each of the numerical values "1" and "2", a value obtained by subtracting "3" is used for each of the numerical values "3" through "6", and a value obtained by subtracting "7" is used for each of the numerical values of at least "7". Besides, the continuation flag of the B24 coding has one bit more than that of the advanced 4BB coding. Several examples of numerical values in the B24 coding are mentioned below:

| Number to be Denoted | Bits |
|---|---|
| 1 | 00 |
| 2 | 01 |
| 3 | 1000 |
| 4 | 1001 |
| 5 | 1010 |
| 6 | 1011 |
| 7 | 1100 0000 |
| 8 | 1100 0001 |
| 9 | 1100 0010 |
| 39 | 1110 0010 0000 |
| 40 | 1110 0010 0001 |

Here, in the case of the numerical value 1 or 2, the top bit is "0", and the next bit expresses the value obtained by subtracting "1" from the original numerical value. In the case of the numerical value 3, 4, 5 or 6, the first 2 bits are "10", and the next 2 bits express the value obtained by subtracting "3" from the original numerical value.

Further, in the case of the numerical value 7, 8 or 9, the second block exists, so that the first 2 bits are "11", and the second block expresses the value obtained by subtracting "7" from the original numerical value. Still further, in the case of the numerical value 39 or 40, the third block is also existent, so that the first 3 bits are "111", and the second and third blocks express the value obtained by subtracting "7" from the original numerical value.

With this method, the minimum number of bits and the maximum number of bits of codes denoting numerical values, each of which is expressed by one word, become 2 bits and 44 bits respectively. In the case of denoting the numerical value 1 or 2, the number of bits can be saved 2 bits with respect to the advanced 4BB coding. In an ordinary DB, the numerical values of most of the "numbers of occurrences of a word within documents" become 1 or 2. It is therefore assumed that, by denoting each of the numerical values 1 and 2 with 2 bits, the compressibilities of actual indices will become higher than in the cases of the 4BB coding and the advanced 4BB coding.

Regarding the encoding process itself, the rate of processing is not considerably lower in comparison with that of the advanced 4BB coding. Further, on condition that most of the numerical values to be encoded are 1 or 2, the number of steps becomes smaller than in the advanced 4BB coding, and hence, the processing rate is higher. The rate of processing in decoding is similar to that in encoding.

FIG. 6 is a block diagram of an information retrieval system which includes data compression/expansion apparatuses based on the encoding methods elucidated above. The information retrieval system shown in FIG. 6 is incarnated by an information processing system in which software is installed. It comprises a magnetic disk unit 11, a floppy disk drive (FDD) 12, a printer 14, a display unit 15, a CPU (central processing unit) 16, a keyboard 17, a pointing device 18 and a main memory 19. These constituents are interconnected by a bus 20.

A document DB 21 and indices 22 are stored in the magnetic disk unit 11. This magnetic disk unit 11 may well be replaced with an optical disk unit, a magneto-optical disk unit, or the like.

The CPU 16 performs the processes necessary for information retrieval by the use of programs stored in the main memory 19. This memory 19 is, for example, a ROM (read only memory) or a RAM (random access memory). Here, an index creation program 23, a retrieval engine (retrieval program) 24, a document display program 25 etc., are retained, and a work area 26 is provided.

The index creation program 23 creates the indices 22 from the document DB 21, and stores them in the magnetic disk unit 11. This program 23 includes a data compression process based on the advanced 4BB coding, the 84BB coding or the B24 coding.

The retrieval engine 24 retrieves the documents of the document DB 21 by the use of the indices 22. In the case of a full-text retrieval system, the retrieval engine 24 retrieves documents containing a word string designated by the user of the retrieval system, while in the case of a ranking retrieval system, it retrieves documents being highly relevant to a word string designated by the user. This retrieval engine 24 includes a data expansion process (decoding process) based on the advanced 4BB coding, the 84BB coding or the B24 coding.

The document display program 25 extracts the designated document on the basis of the retrieved result, and displays it to the user. The work area 26 is an area which the programs 23, 24 and 25 use for the processes.

In addition, the keyboard 17 and the pointing device 18 are used for inputting a request and an instruction from the user, while the printer 14 and the display unit 15 are used for outputting an inquiry, a processed result etc., to the user.

The FDD 12 drives a floppy disk 13, and accesses the stored content thereof. The floppy disk 13 can store therein the programs 23, 24 and 25 etc., besides the necessary data. It is possible to use any desired computer-readable storage medium other than the floppy disk 13, such as a memory card, a CD-ROM (compact-disk read only memory), an optical disk or a magneto-optical disk.

Further, in a case where the information retrieval system is furnished with a network connection device, not shown, it can be connected to any desired communication network such as LAN (local area network) so as to receive necessary data and programs from a database etc., lying outside.

The advanced 4BB coding, 84BB coding and B24 coding for use in the data compression/expansion apparatuses of the present invention will now be described in more detail with reference to FIGS. 7 through 24.

In FIGS. 7 through 24, variable "Value" denotes the bit pattern of original data, and variable "Bitbuf" denotes an encoded bit pattern. Besides, symbol ":=" denotes the operation of substituting the value of a right-hand side into that of a left-hand side, and symbol "bitcopy (first argument, second argument)" denotes the operation of copying the bit pattern of a second argument at the top of a first argument.

Symbol "bitcat (first argument, second argument)" represents the operation of adding the bit pattern of a second argument behind a first argument, and symbol "read (first argument, second argument)" represents the operation of reading a bit pattern in the number of bits indicated by a second argument, from a first argument, and then turning the read bit pattern into a numerical value. The other statements are the same as the symbols of the C language or mathematics.

Figure 7:
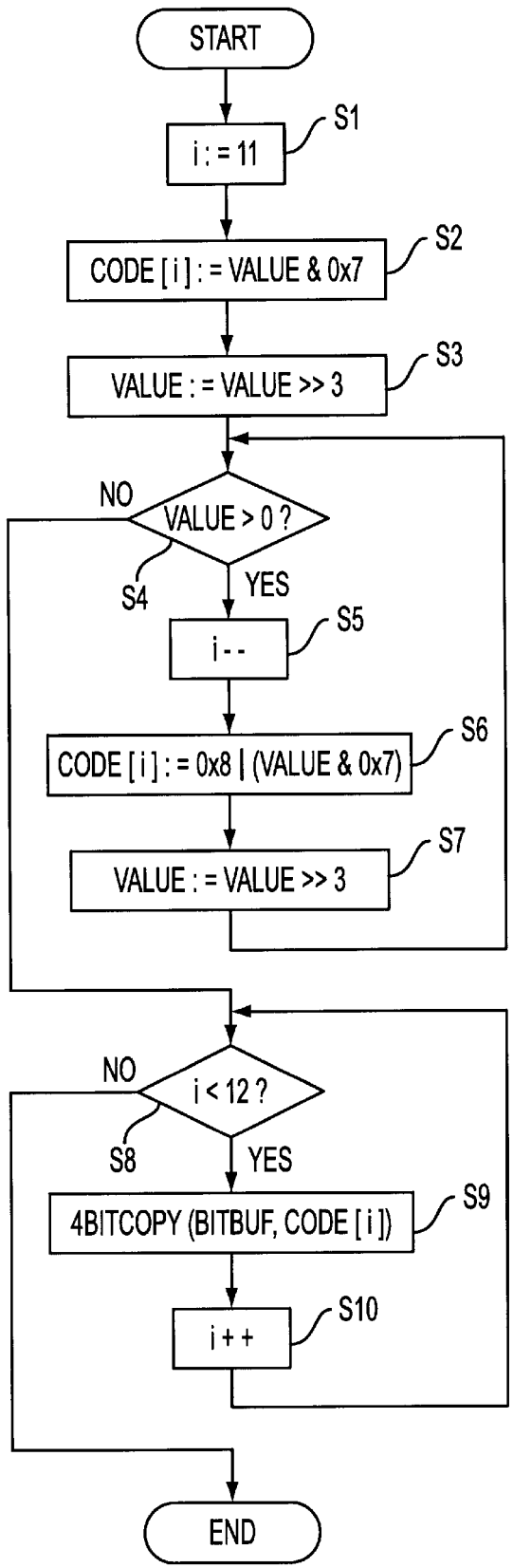
FIG. 7 is a flow chart of a 4BB coding process.

For the sake of comparisons, actual examples of a 4BB coding process and a 4BB decoding process shall be explained. FIG. 7 is the flow chart of the 4BB coding process. When the process has been started, the information retrieval system first puts i=11 (step S1). It prepares a primary buffer "Code[i]" of 8 bits, and sets the lower 3 bits of the bit pattern of the variable "Value" in the latter half of the primary buffer "Code[i]" (step S2). Here, an expression "Value & 0x7" denotes the logical product between the "Value" and "0x7" (="0111").

Subsequently, the "Value" is shifted 3 bits to the right (step S3), and the magnitude of the "Value" is compared with "0" (step S4). In a case where the "Value" is greater than "0", the value "i" is decreased by "1" (step S5). The value "1" of a flag is affixed before the lower 3 bits of the shifted "Value", and the resulting 4 bits are set in the latter half of the "Code[i]" (step S6). Here, an expression "0x8; (Value & 0x7)" denotes the logical sum between "0x8" (="1000") and the lower 3 bits of the "Value". Thereafter, the "Value" is shifted 3 bits to the right (step S7), and the processing at the step S4 et seq. is iterated.

When the magnitude of the "Value" has become "0" at the step S4, this step is followed by the comparison between the "i" and 12 (step S8). If the "i" is less than 12, the data of the 4 bits stored in the latter half of the "Code[i]" is copied into the top part of the free area of the variable "Bitbuf" (step S9). The "i" is incremented by "1" (step S10).

Thereafter, the processing at the step S8 et seq. is iterated. When the "i" has reached 12 at the step S8, the process is ended. The program codes (described in the C language) of such a coding process become as shown in FIG. 8 by way of example.

Figure 9:
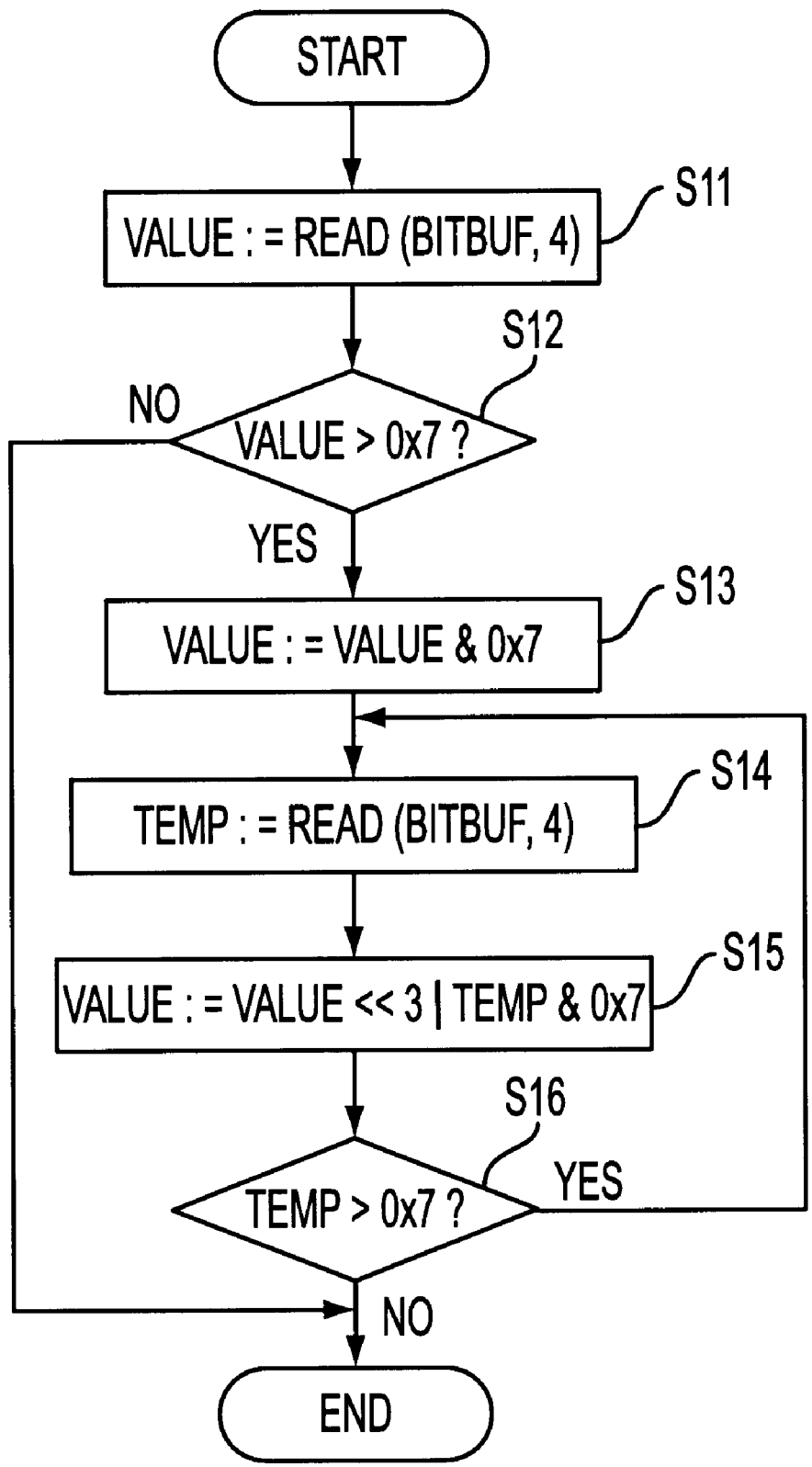
FIG. 9 is a flow chart of a 4BB decoding process.

FIG. 9 is the flow chart of the 4BB decoding process. When the process has been started, the information retrieval system first reads the initial 4 bits of the variable "Bitbuf" and sets them in the variable "Value" (step S11). It compares the set value with the value "0x7" (step S12). In a case where the "Value" is equal to, or less than, the "0x7", a flag at the top bit is "0", which signifies that no succeeding block is existent. Therefore, the process is ended without any further step.

In contrast, if the "Value" is greater than the "0x7", the flag at the top bit is "1", which signifies that a succeeding block is existent. Therefore, only the lower 3 bits of the bit pattern of the "Value" are set as the "Value" anew (step S13), and the succeeding 4 bits within the "Bitbuf" are read and set in a variable "temp" (step S14).

Subsequently, the "Value" is shifted 3 bits to the left, and the lower 3 bits of the "temp" are added to the resulting "Value" (step S15). Thus, a remaining part, obtained by removing the flag of the top bit from the "temp", is affixed to the "Value". Thereafter, the value of the "temp" is compared with the "0x7" (step S16).

If the "temp" is greater than the "0x7", the processing at step S14 et seq. is iterated, and if not, the process is ended. The bit pattern of the "Value" at the end of the process denotes the original data corresponding to the "Bitbuf". The program codes (described in the C language) of such a decoding process become as shown in FIG. 10 by way of example. In the example of FIG. 10, an expression "get_xbits(Bitbuf)" denotes a function which serves to read out a bit pattern for "x" bits from the "Bitbuf".

Figure 11:
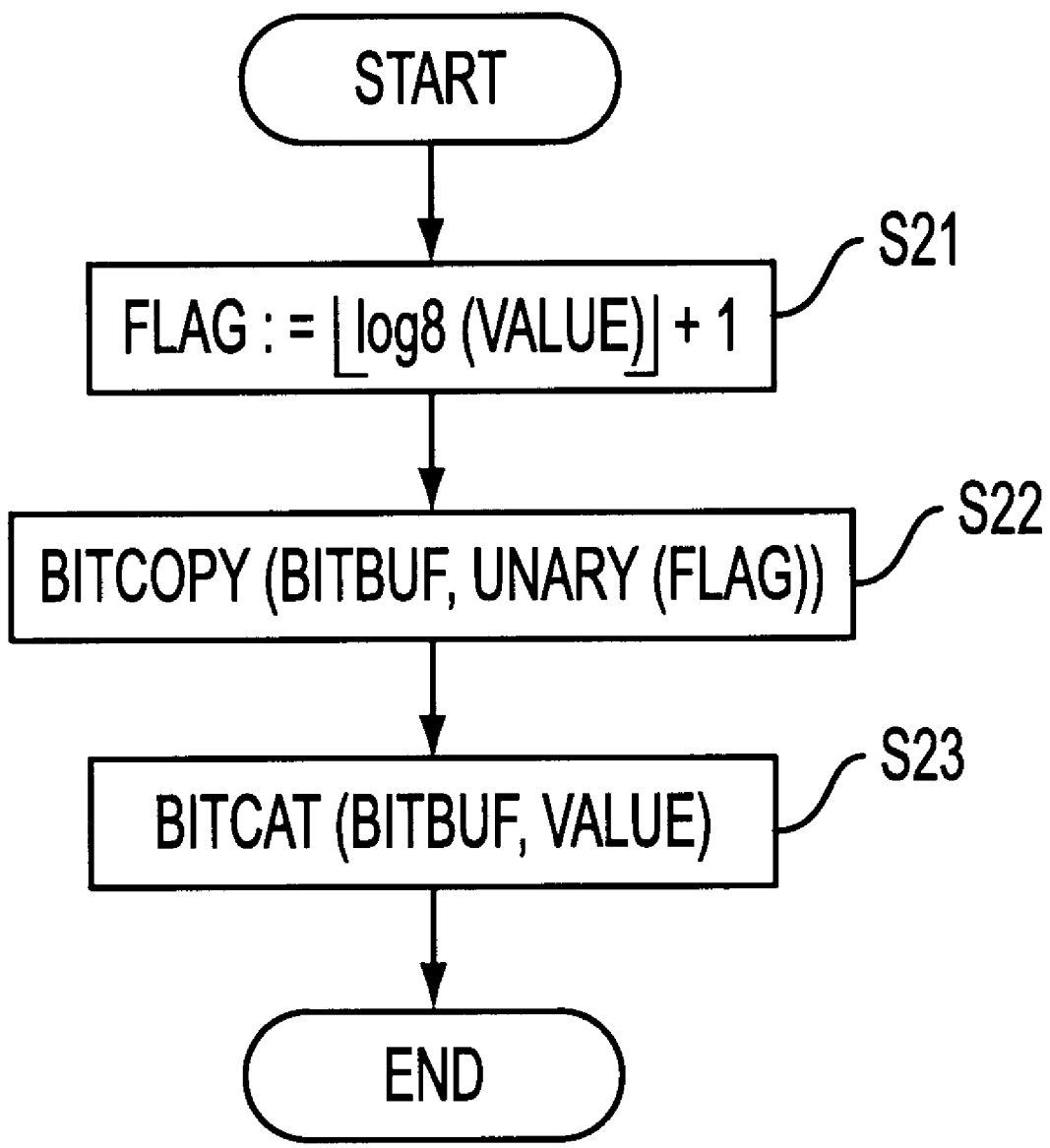
FIG. 11 is a flow chart of an advanced 4BB coding process.

Now, an advanced 4BB coding process and an advanced 4BB decoding process will be described. FIG. 11 is the flow chart of the advanced 4BB coding process. When the process has been started, the information retrieval system first calculates "I2(Value)=Out2":

$$\lfloor \log_8(\text{value}) \rfloor$$

and sets "I2(Value)+1" as the value of a continuation flag "Flag" (step S21). Here, an expression "I2(x)=Out3" shall denote the maximum integer among integers which are not greater than the value of $\log_8 x$:

$$\lfloor \log_8 x \rfloor$$

Subsequently, the "Flag" is converted into a unary code, which is set in the variable "Bitbuf" (step S22), and the variable "Value" is set so as to succeed the "Bitbuf" (step S23). Then, the process is ended.

When FIG. 11 is compared with FIG. 7, it is understood that the number of steps of the advanced 4BB coding process is much smaller than that of the 4BB coding process. Since, with the advanced 4BB coding, merely the continuation flag is affixed before the bit pattern of the original data, the number of steps may be small in this manner, and a high-speed process is realized. Besides, if the continuation flag has a small value, the unary code thereof is readily obtained.

The program codes (described in the C language) of the advanced 4BB coding process become as shown in FIG. 12 by way of example. In the example of FIG. 12, operations "if-else if" are substituted for the actual computation of the values "I2(Value)". The reason therefore is that the limits of the magnitudes of the "Value" and those of the values of the "I2(Value)" corresponding thereto are known beforehand. Besides, in the example of FIG. 12, an expression set_xbits (Bitbuf, X)" denotes a function which serves to read out a bit pattern for "x" bits from the "X" and to write the bit pattern into the "Bitbuf".

By way of example, a numerical value of 21 in the decimal notation is encoded in accordance with the following steps, and the corresponding code "10010101" is obtained:

1. Since I2(21)+1=2 holds, the continuation flag becomes "2" (step S21).

2. The continuation flag "2" is set in the "Bitbuf" in terms of the unary code "10" (step S22).

3. The bit pattern "010101" of the "Value"=21 is set in the "Bitbuf" so as to succeed the continuation flag (step S23).

As another example, a numerical value of 300 in the decimal notation is encoded in accordance with the following steps, and the corresponding code "110100101100" is obtained:

1. Since I2(300)+1=3 holds, the continuation flag becomes "3" (step S21).

2. The continuation flag "3" is set in the "Bitbuf" in terms of the unary code "110" (step S22).

3. The bit pattern "100101100" of the "Value"=300 is set in the "Bitbuf" so as to succeed the continuation flag (step S23).

Figure 13:
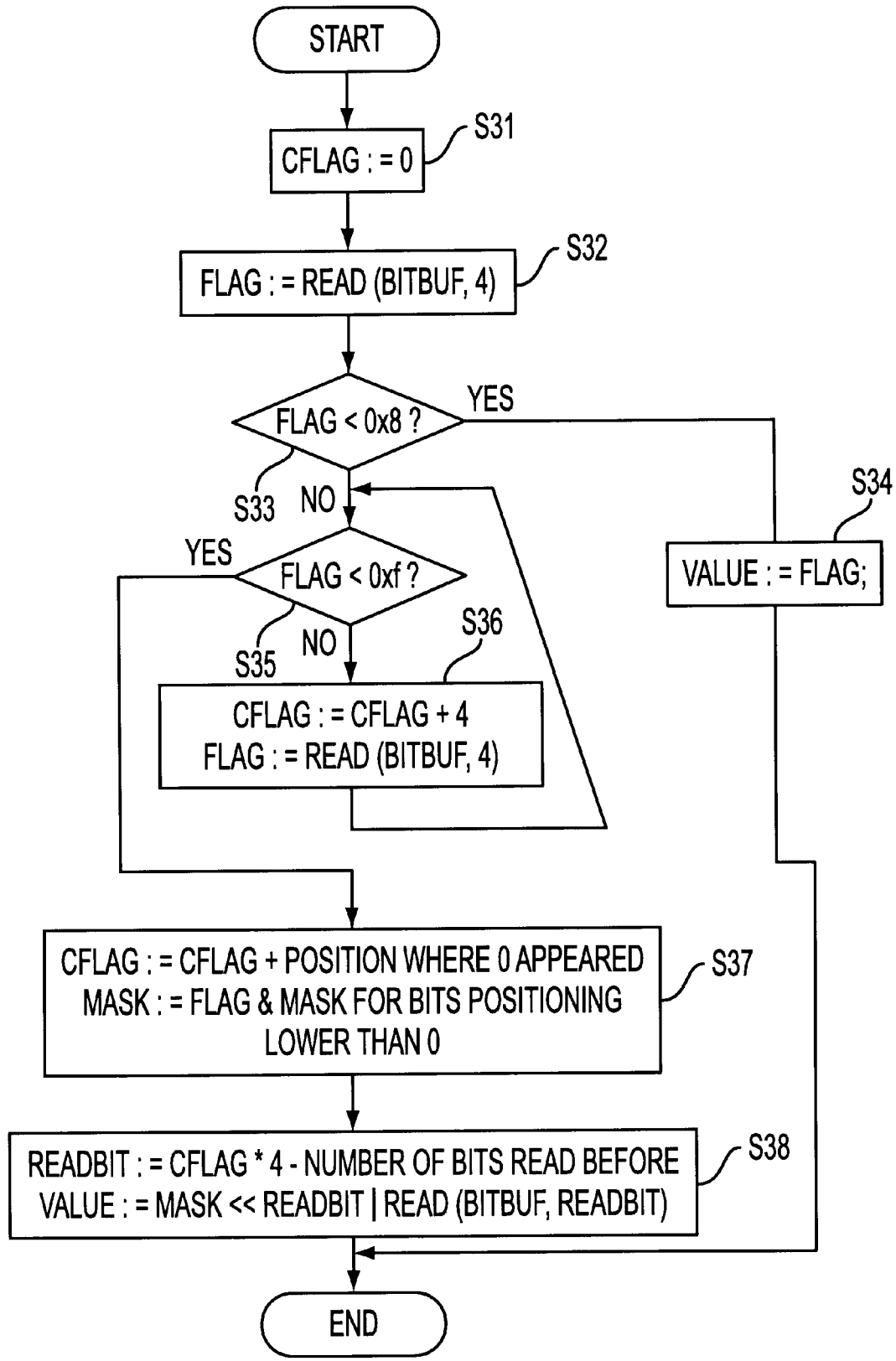
FIG. 13 is a flow chart of an advanced 4BB decoding process.

Next, FIG. 13 is the flow chart of the advanced 4BB decoding process. When the process has been started, the information retrieval system first puts "0" in a variable "CFlag" denoting the number of bits of the continuation flag (step S31), it reads the initial 4 bits of the variable "Bitbuf" and sets them in the variable "Flag" (step S32), and it compares the set value with the value "0x8" (step S33).

In a case where the "Flag" is less than the "0x8", the top bit is "0", which signifies that no succeeding block is existent. Therefore, the "Flag" is substituted into the variable "Value" (step S34), and the process is ended.

In contrast, if the "Flag" is equal to or greater than the "0x8", the top bit is "1", which signifies that at least one succeeding block is existent. Therefore, the "Flag" is compared with a value "0xf" (="1111") in order to check if the first succeeding block corresponds to the continuation flag (step S35).

If the "Flag" is equal to the value "0xf", the further succession of the block of the continuation flag is understood. Therefore, "4" is added to the "CFlag", and the succeeding 4 bits within the "Bitbuf" are read and set in the "Flag" (step S36). Thereafter, the processing at step S35 et seq. is iterated.

On the other hand, if the "Flag" is less than "0xf", the bit pattern thereof contains "0", and the interruption of the continuation flag is understood. Therefore, the order of a position where "0" appeared within the "Flag" for the first time is added to the "CFlag". Besides, bits lower than the position are masked, and they are extracted and substituted into a variable "Mask" (step S37).

Subsequently, a value is calculated in such a way that the number of bits read from the "Bitbuf" before is subtracted from quadruple the "CFlag", and it is set as a variable "ReadBit" (step S38). The total number of bits of data contained in the "Bitbuf" is obtained by multiplying the "CFlag" by 4, and the total number of bits of remaining data is obtained by subtracting the number of the read bits from the product.

Subsequently, the "Mask" is shifted to the left for the number of bits of the "ReadBit" and then substituted into the "Value", and the remaining data in the number of bits of the "ReadBit" is read from the "Bitbuf" and then added to the "Value". Thereafter, the process is ended. Thus, the bit pattern of the original data, with the part of the continuation flag removed, is obtained as the "Value".

When FIG. 13 is compared with FIG. 9, it is understood that the number of steps of the advanced 4BB decoding process is somewhat larger than that of the 4BB decoding process. In the processing within loops shown in FIG. 9 and FIG. 13, however, the 4BB decoding needs to read the continuation flag and the data part simultaneously, whereas the advanced 4BB decoding may read only the continuation flag part. For this reason, the processing speed of the advanced 4BB decoding does not considerably differ from that of the 4BB decoding in the case of decoding a code of one block or 2 blocks or so, but the former becomes much higher in the case of decoding a large number of blocks.

The program codes (described in the C language) of the advanced 4BB decoding process become as shown in FIG. 14 by way of example. In the example of FIG. 14, operations "if-else if" are substituted for the actual computation of the values "CFlag" and "ReadBit". The reason therefore is that the limits of the magnitudes of the "Value" and those of the values of the "ReadBit" corresponding thereto are known beforehand. Besides, the variable "Value" is employed instead of the variable "Flag", and the logical product between the variable "Value" and the masking bit pattern is employed instead of the variable "Mask".

By way of example, the code "10010101", mentioned before, is decoded in accordance with the following steps, and the corresponding numerical value "21" is obtained:

1. The initial 4 bits "1001" are read and set (step S32).
2. The continuation flag is "10", which corresponds to the higher 2 bits, so that the lower 2 bits are masked to obtain the "Mask"="1001" & "0x3"="0001" (step S37). Besides, the "ReadBit"=2×4−4=4 holds, so that the bit pattern "0001" is shifted 4 bits to the left and then substituted into the "Value" (step S38). Thus, the "Value"="10000"=16 is obtained.
3. "0101"=5 being the succeeding 4 bits (the number of bits of the "ReadBit") are read and are added to the "Value" (step S38). Thus, the "Value"=16+5=21 is obtained.

Besides, the code "110100101100", mentioned before, is decoded in accordance with the following steps, and the corresponding numerical value "300" is obtained:

1. The initial 4 bits "1101" are read and set (step S32).
2. The continuation flag is "110", which corresponds to the higher 3 bits, so that the lower 1 bit is masked to obtain the "Mask"="1101" & "0x1"="0001" (step S37). Besides, the "ReadBit"=3×4−4=8, so that the bit pattern "0001" is shifted 8 bits to the left and then substituted into the "Value" (step S38). Thus, the "Value"="100000000"=256 is obtained.
3. "00101100"=44 being the succeeding 8 bits (the number of bits of the "ReadBit") are read and are added to the "Value" (step S38). Thus, the "Value"=256+44=300 is obtained.

Figure 15:
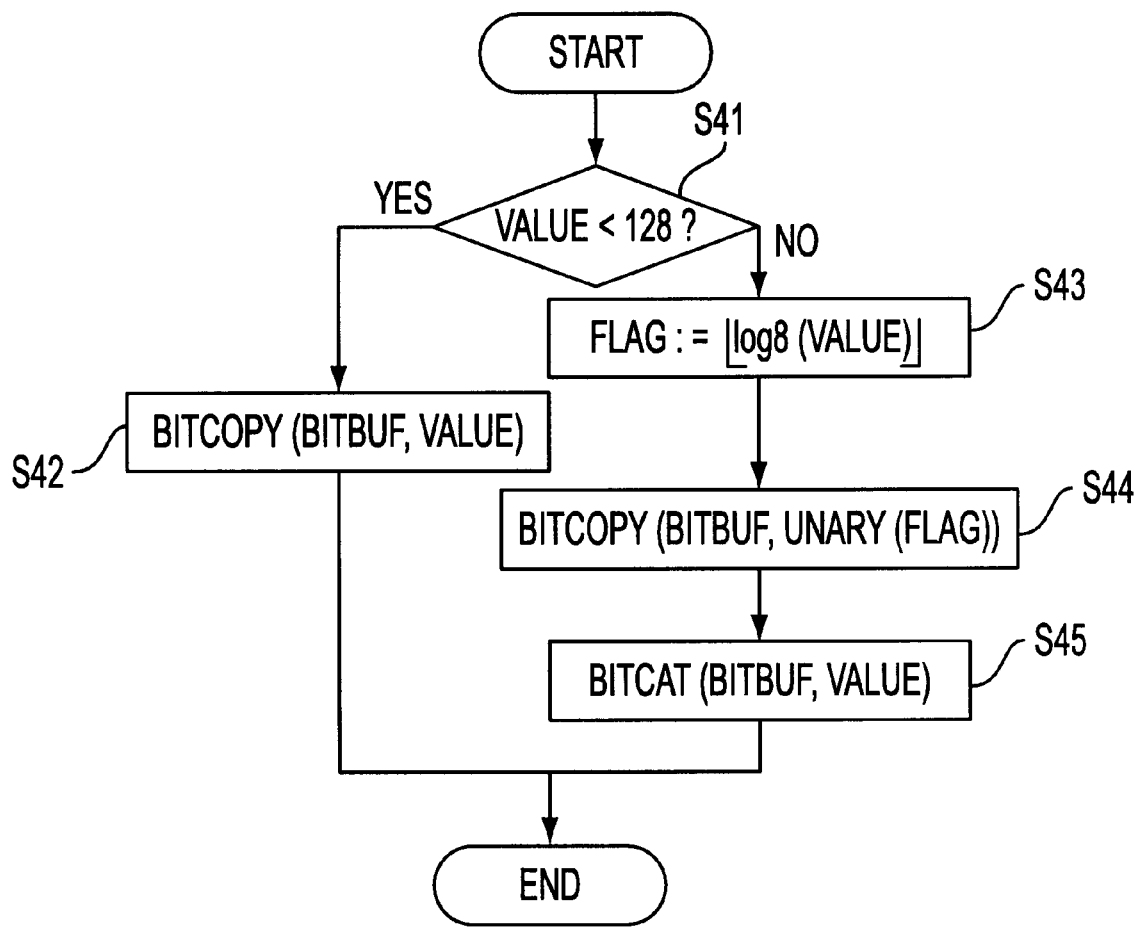
FIG. 15 is a flow chart of an 84BB coding process.

Now, an 84BB coding process and an 84BB decoding process will be described. FIG. 15 is the flow chart of the 84BB coding process. When the process has been started, the information retrieval system first compares the magnitude of the variable "Value" with 128 (step S41).

Herein, if the "Value" is less than 128, it is copied into the variable "Bitbuf" (step S42), whereupon the process is ended.

On the other hand, if the "Value" is equal to, or greater than, 128, the value I2(Value) is calculated using the formula "I2(x)" mentioned before, and it is set as the value of the continuation flag "Flag" (step S43). Subsequently, the "Flag" is converted into a unary code, which is set in the variable "Bitbuf" (step S44), and the "Value" is set so as to succeed the "Flag" (step S45). Thereafter, the process is ended.

When FIG. 15 is compared with FIG. 11, merely one more step of deciding the condition increases in the 84BB coding process than in the advanced 4BB coding process. Therefore, the processing speed of the 84BB coding is hardly different from that of the advanced 4BB coding.

The program codes (described in the C language) of the 84BB coding process become as shown in FIG. 16 by way of example. In the example of FIG. 16, operations "if-else if" are substituted for the actual computation of the values "I2(Value)" in the same manner as in the advanced 4BB coding.

By way of example, the numerical value of 300, mentioned before, is encoded in accordance with the following steps, and the corresponding code "100100101100" is obtained:

1. Since I2(300)=2 holds, the continuation flag becomes "2" (step S43).
2. The continuation flag "2" is set in the "Bitbuf" in terms of the unary code "10" (step S44).
3. The bit pattern "0100101100" of the "Value"=300, is set in the "Bitbuf " so as to succeed the continuation flag (step S45).

Figure 17:
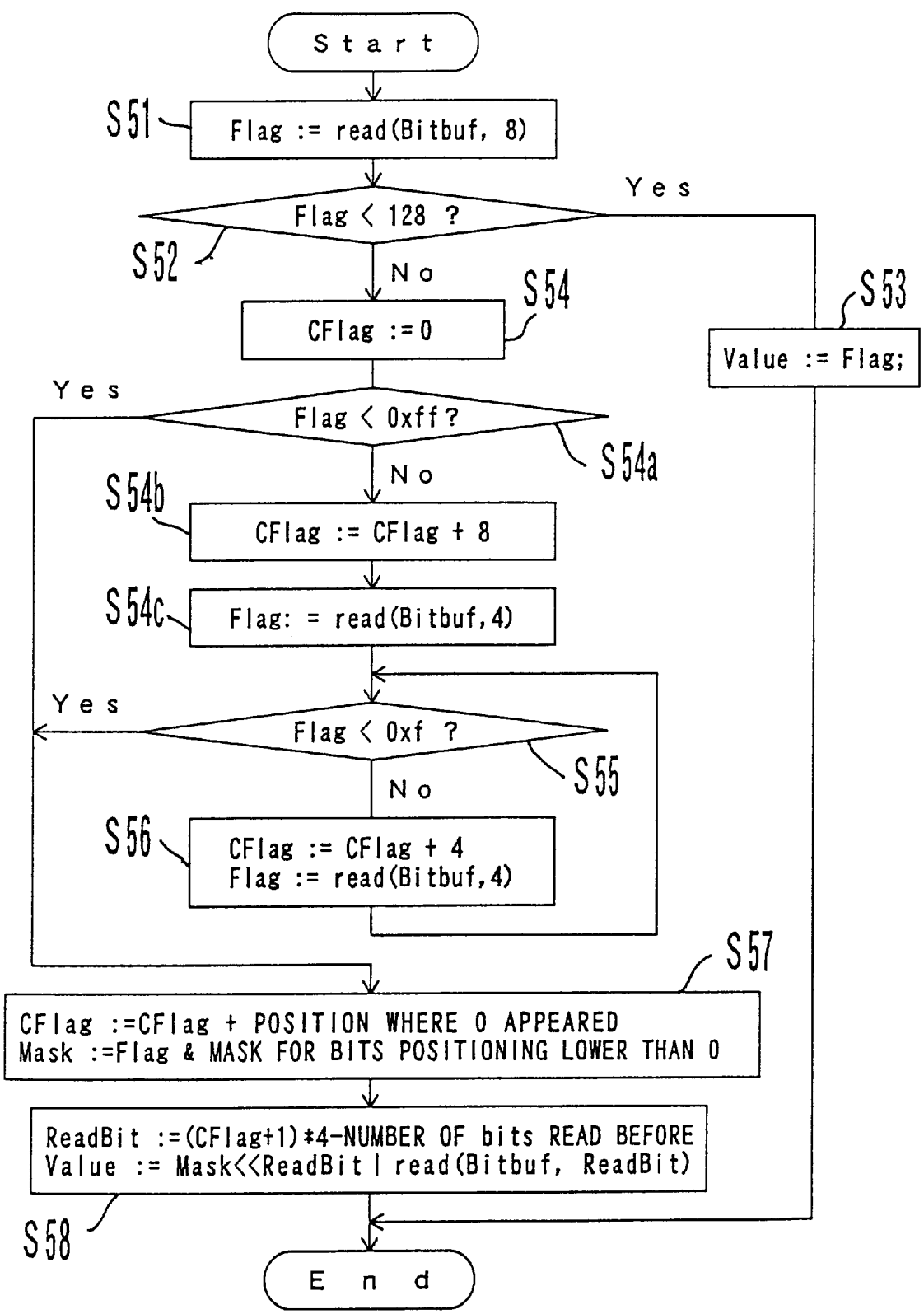
FIG. 17 is a flow chart of an 84BB decoding process.

Next, FIG. 17 is the flow chart of the 84BB decoding process. When the process has been started, the information retrieval system first reads the initial 8 bits of the variable "Bitbuf" and sets them in the variable "Flag" (step S51), and it compares the set value with 128 (step S52).

In a case where the "Flag" is less than 128, the top bit is "0", which signifies that no succeeding block is existent. Therefore, the "Flag" is substituted into the variable "Value" (step S53), and the process is ended.

On the other hand, in a case where the "Flag" is equal to or greater than 128, the top bit is "1", which signifies that at least one succeeding block is existent. Therefore, the variable "CFlag" denoting the number of bits of the continuation flag is set at "0" (step S54), and the value of the "Flag" is compared with a value "0xff" (="11111111") in order to check if the first succeeding block corresponds to the continuation flag (step S54a).

If the "Flag" is equal to the value "0xff", the further succession of the block of the continuation flag is understood. Therefore, "8" is added to the "CFlag" (step S54b), and the succeeding 4 bits within the "Bitbuf" are read and set in the "Flag" (step S54c). Subsequently, the value of the "Flag" is compared with a value "0xf" (="1111") in order to check if the block succeeding the read block corresponds to the continuation flag (step S55).

If the "Flag" is equal to the value "0xf", the further succession of the block of the continuation flag is understood. Therefore, "4" is added to the "CFlag", and the succeeding 4 bits within the "Bitbuf" are read and set in the "Flag" (step S56). Thereafter, the processing at the step S55 et seq. is iterated.

On the other hand, when the "Flag" is less than "0xff" at step S54a or when it is less than "0xf" at step S55, the bit pattern thereof contains "0", and the interruption of the continuation flag is understood. Therefore, the order of a position where "0" appeared within the "Flag" for the first time is added to the "CFlag". Besides, bits lower than the position are masked, and they are extracted and substituted into a variable "Mask" (step S57).

Subsequently, a value is calculated in such a way that the number of bits read before from the "Bitbuf" is subtracted from quadruple a magnitude "(CFlag+1)", and it is set as a variable "ReadBit" (step S58). Subsequently, the "Mask" is shifted to the left for the number of bits of the "ReadBit" and then substituted into the "Value", and the remaining data in the number of bits of the "ReadBit" is read from the "Bitbuf" and then added to the "Value". Thereafter, the process is ended. Thus, the bit pattern of the original data, with the part of the continuation flag removed, is obtained as the "Value".

The program codes (described in the C language) of such an 84BB decoding process become as shown in FIG. 18 by way of example. In the example of FIG. 18, operations "if-else if" are substituted for the actual computation of the values "CFlag" and "ReadBit" in the same manner as in the advanced 4BB decoding. Besides, the variable "Value" is employed instead of the variable "Flag", and the logical product between the variable "Value" and the masking bit pattern is employed instead of the variable "Mask".

By way of example, the code "100100101100", mentioned before, is decoded in accordance with the following steps, and the corresponding numerical value "300" is obtained:

1. The initial 8 bits "10010010" are read and set (step S51).

2. The continuation flag is "10", which corresponds to the higher 2 bits, so that the lower 6 bits are masked to obtain the "Mask"="10010010" & "0x3f"="00010010" (step S57).

Besides, the "ReadBit"=(2+1)×4−8=4 holds, so that the bit pattern "00010010" is shifted 4 bits to the left and then substituted into the "Value" (step S58). Thus, the "Value"= "100100000"=288 is obtained.

3. "1100"=12 being the succeeding 4 bits (the number of bits of the "ReadBit") are read, and are added to the "Value" (step S58). Thus, the "Value"=288+12=300 is obtained.

Figure 19:
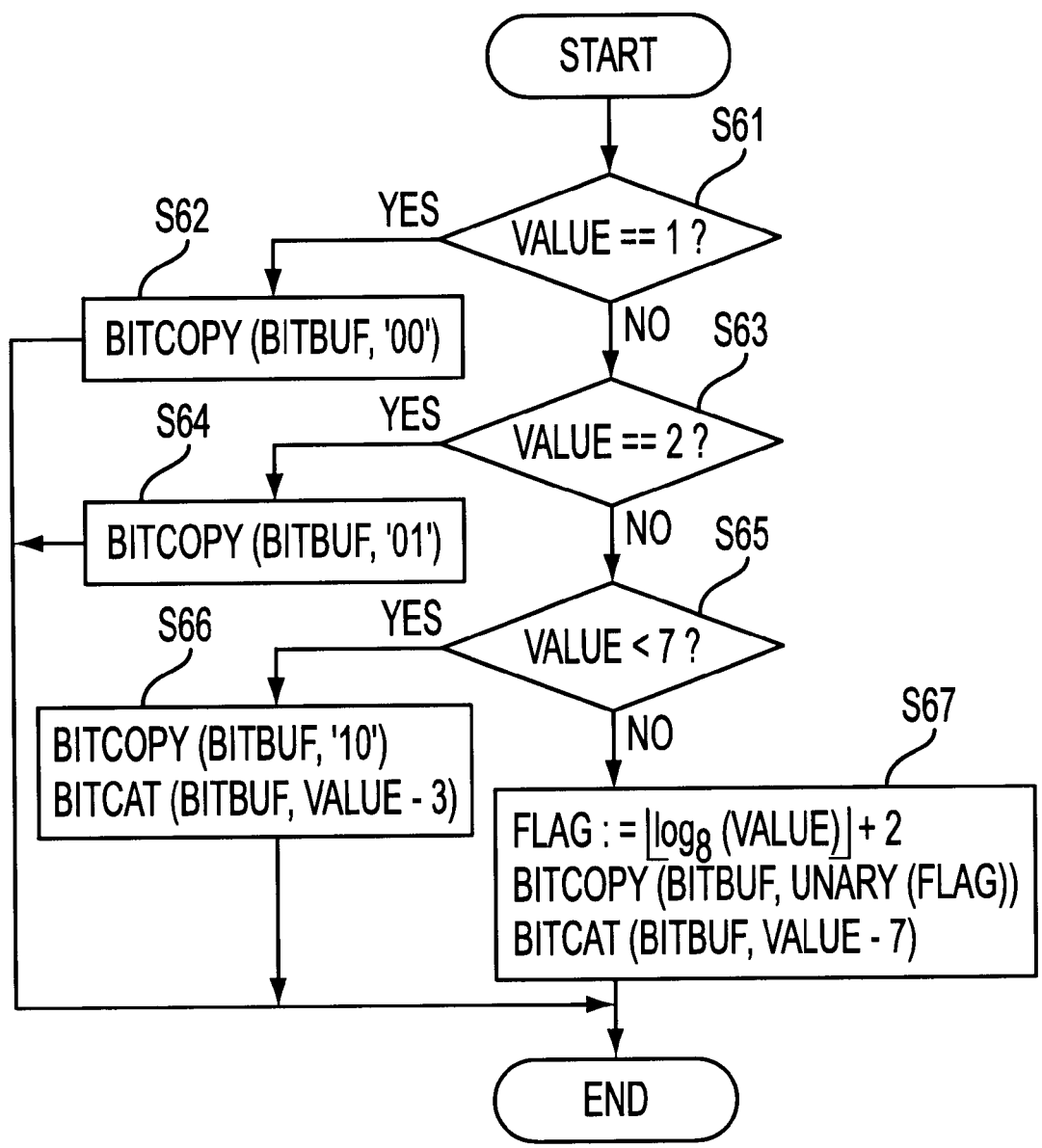
FIG. 19 is a flow chart of a B24 coding process.

Now, a B24 coding process and a B24 decoding process will be described. FIG. 19 is the flow chart of the B24 coding process. When the process has been started, the information retrieval system first compares the variable "Value" with "1" (step S61). In case of the "Value"=1, a bit pattern "00" is put in the variable "Bitbuf" (step S62), whereupon the process is ended.

If the "Value" is not "1", it is subsequently compared with "2" (step S63). In the case of the "Value"=2, a bit pattern "01" is put in the "Bitbuf" (step S64), whereupon the process is ended.

If the "Value" is not "2", it is subsequently compared with "7" (step S65). If the "Value" is less than "7", a bit pattern "10" is put in the "Bitbuf" as the continuation flag, and a bit pattern "(Value−3)" is set so as to succeed the flag (step S66). Thereafter, the process is ended.

If the "Value" is equal to or greater than "7", the value "I2(Value)" is calculated using the formula "I2(x)" mentioned before, and a value "I2(Value)+2" is substituted into the variable "Flag" (step S67). Subsequently, the "Flag" is converted into a unary code, which is put in the "Bitbuf", and a bit pattern "(Value−7)" is set so as to succeed the "Flag". Thereafter, the process is ended.

As understood by comparing FIG. 19 with FIG. 11, on condition that the "Value" is 1 or 2, the number of steps of the B24 coding process becomes smaller than that of the advanced 4BB coding process, and hence, the processing speed of the B24 coding process becomes higher. Besides, the processing of step S67 in FIG. 19 corresponds to that of steps S21, S22 and S23 in FIG. 11. Accordingly, even when the "Value" is 7 or greater, merely three more steps of deciding the conditions are added in the B24 coding process than in the advanced 4BB coding process. Therefore, the processing speed of the B24 coding does not become considerably lower. The same applies also to cases where the "Value" is 3 through 6.

The program codes (described in the C language) of the B24 coding process become as shown in FIG. 20 by way of example. In the example of FIG. 20, operations "if-else if" are substituted for the actual computation of the values "I2(Value)" in the same manner as in the advanced 4BB coding explained before.

By way of example, the numerical value of 21, mentioned before, is encoded in accordance with the following steps, and the corresponding code "11001110" is obtained:

1. Since I2(21)+2=3 holds, the continuation flag becomes "3" (step S67).

2. The continuation flag "3" is set in the "Bitbuf" in terms of the unary code "110" (step S67).

3. The bit pattern "01110" of a value ("Value"−7)=21−7=14 is set in the "Bitbuf" so as to succeed the continuation flag (step S67).

Figure 21:
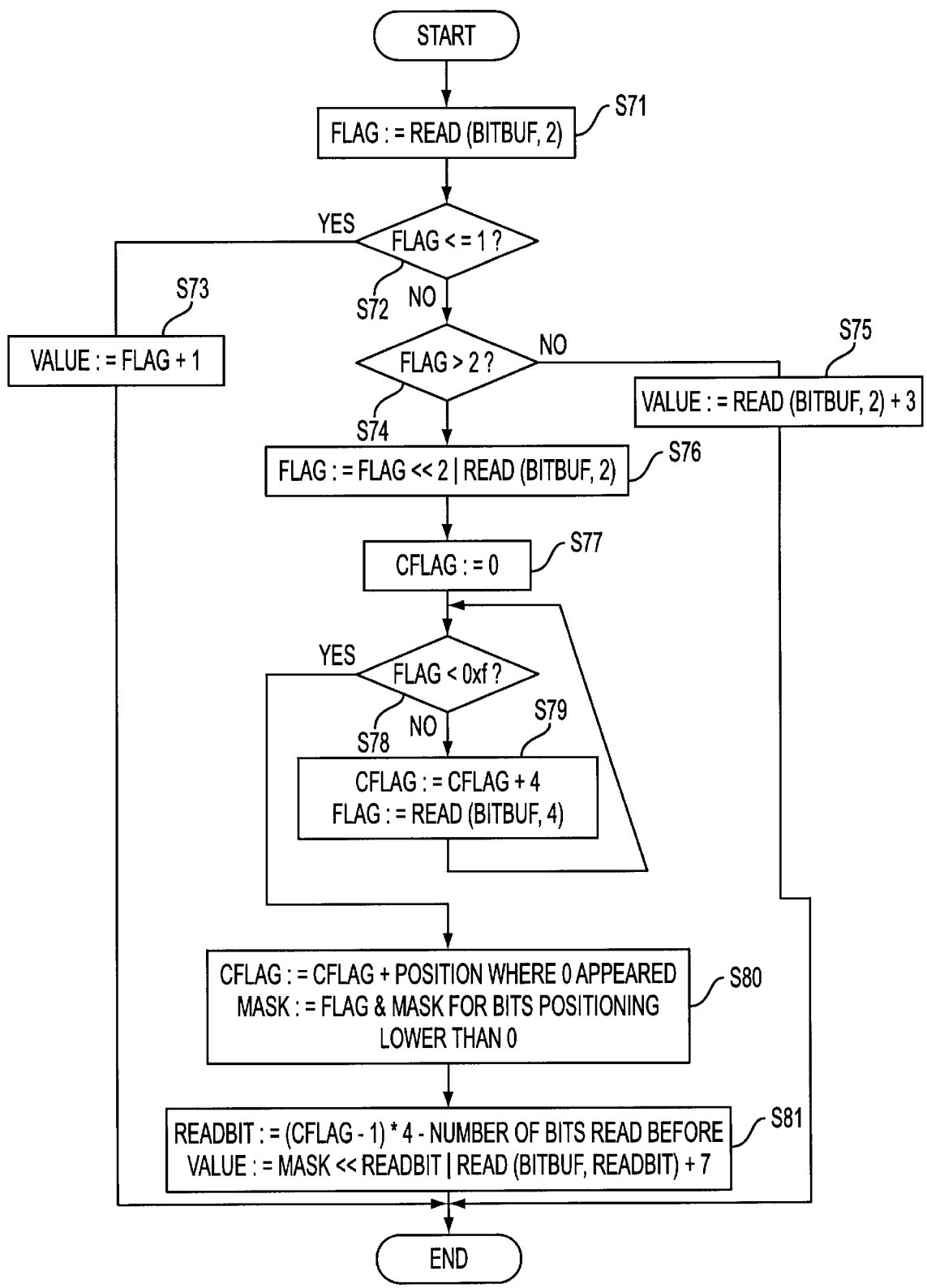
FIG. 21 is a flow chart of a B24 decoding process.

Next, FIG. 21 is the flow chart of the B24 decoding process. When the process has been started, the information retrieval system first reads and sets the initial 2 bits of the variable "Bitbuf" in the variable "Flag" (step S71). It compares the set value with "1" (step S72).

In a case where the "Flag" is equal to or less than "1", the top bit is "0", which signifies that no succeeding bit pattern is existent. Therefore, the bit pattern of a value ("Flag"+1)

is substituted into the variable "Value" (step S73), whereupon the process is ended.

In contrast, if the "Flag" is greater than "1", the top bit is "1", which signifies that a succeeding bit pattern is existent. Therefore, the value of the "Flag" is subsequently compared with "2" (step S74).

If the "Flag" is "2", it signifies that the succeeding bit pattern is composed of 2 bits. Therefore, the remaining 2 bits of the "Bitbuf" are read and set in the "Value", and "3" is added thereto (step S75), whereupon the process is ended.

If the "Flag" is greater than "2", it is "11", which signifies that at least one succeeding block is existent. Therefore, the "Flag"=11" is shifted 2 bits to the left, and the value of the succeeding 2 bits of the "Bitbuf" are read and then added to the "Flag" (step S76). Besides, the variable "CFlag", denoting the number of bits of the continuation flag, is set at "0" (step S77), and the "Flag" is compared with a value "0xf" (="1111") in order to check if the first succeeding block corresponds to the continuation flag (step S78).

If the "Flag" is equal to the "0xf", the further succession of the block of the continuation flag is understood. Therefore, "4" is added to the "CFlag", and the succeeding 4 bits within the "Bitbuf" are read and set in the "Flag" (step S79). Thereafter, the processing at the step S78 et seq. is iterated.

On the other hand, if the "Flag" is less than "0xf", the bit pattern thereof contains "0", and the interruption of the continuation flag is understood. Therefore, the order of a position where "0" appeared within the "Flag" for the first time is added to the "CFlag". Besides, bits lower than the position are masked, and they are extracted and substituted into the variable "Mask" (step S80).

Subsequently, a value is calculated in such a way that the number of bits read before from the "Bitbuf" is subtracted from quadruple a magnitude "(CFlag−1)", and it is set as the variable "ReadBit" (step S81). Besides, the "Mask" is shifted to the left for the number of bits of the "ReadBit" and then substituted into the "Value", and the remaining data in the number of bits of the "ReadBit" is read from the "Bitbuf" and then added to the "Value". Thus, the bit pattern, with the part of the continuation flag removed from the code, is obtained as the "Value". In order to obtain the original data, "7" is further added to the "Value". Thereafter, the process is ended.

When FIG. 21 is compared with FIG. 13, one more step of deciding the condition is required in the B24 decoding process than in the advanced 4BB decoding process, but the processing speed of the B24 decoding process does not become considerably lower.

The program codes (described in the C language) of the B24 decoding process become as shown in FIG. 22 by way of example. In the example of FIG. 22, operations "if-else if" are substituted for the actual computation of the values "CFlag" and "ReadBit" in the same manner as in the advanced 4BB decoding. Besides, the variable "Value" is employed instead of the variable "Flag", and the logical product between the variable "Value" and the masking bit pattern is employed instead of the variable "Mask".

By way of example, the code "11001110", mentioned before, is decoded in accordance with the following steps, and the corresponding numerical value "21" is obtained:

1. The initial 2 bits "11" are read and set in the "Flag" (step S71).

2. Since the read value is "3", the "Flag" is shifted 2 bits to the left, and the succeeding 2 bits "00" are further read and set (step S76). The continuation flag is checked (step S78). Here, it is found that the continuation flag is "110".

3. Since the continuation flag interrupts at the third bit, the remaining 1 (one) bit succeeding the continuation flag is masked to obtain the "Mask"="1101" & "0x1"="0000". Besides, the "ReadBit"=(3−1)×4−4=4 holds, so that the bit pattern "0000" is shifted 4 bits to the left and then substituted into the "Value" (step S81).

4. "1110"=14 being the succeeding 4 bits (the number of bits of the "ReadBit") are read, and are added to the "Value" to which "7" is further added (step S81). Thus, the "Value"= 14+7=21 is obtained.

The numbers of bits required for the advanced 4BB (4-bit block) coding, 84BB (8/4-bit block) coding and B24 (block-24) coding thus far described, will be compared in FIG. 23 with those required for the 4BB coding, 8BB (8-bit block) coding, γ-coding and δ-coding.

It is seen from FIG. 23 that most encoding methods express smaller numerical values with smaller numbers of bits and larger numerical values with larger numbers of bits. Which coding scheme attains the highest compressibility for a certain numerical value string given, greatly differs depending upon the limits of numerical values frequently occurring or appearing within the numerical value string.

By way of example, for a numerical value string in which only "1" and "2" often appear, the B24 coding is anticipated to achieve the highest compressibility, and for a numerical value string in which values of and near 512 often appear, the 84BB coding can be expected to achieve the highest compressibility.

Further, when a number "4294967295" being the maximum number expressible with 32 bits is encoded by the respective methods, the resulting codes have bit patterns and the numbers of bits as listed in FIG. 24.

Meanwhile, the "occurring positions of a word within documents" for use in indices are not always small numerical values, but they often become considerably large numerical values even when the information of differences are utilized. In the case of handling such large numerical values, the efficiency of compression does not heighten with any of the encoding methods.

In the present invention, therefore, the original numerical data items, such as the "occurring positions of a word within documents", shall be divided by an appropriate integer value, thereby to coarsen the grains of information and to convert the data items into smaller interim numerical values. Regarding small numerical values, the efficiency of compression heightens with any of the encoding methods as seen from FIG. 23. The coding which adopts the conversion stated above shall be called the "Per coding". Especially, the case of denoting the denominator of the division by letter "n" shall be called the "Per(n) coding".

Figure 25:
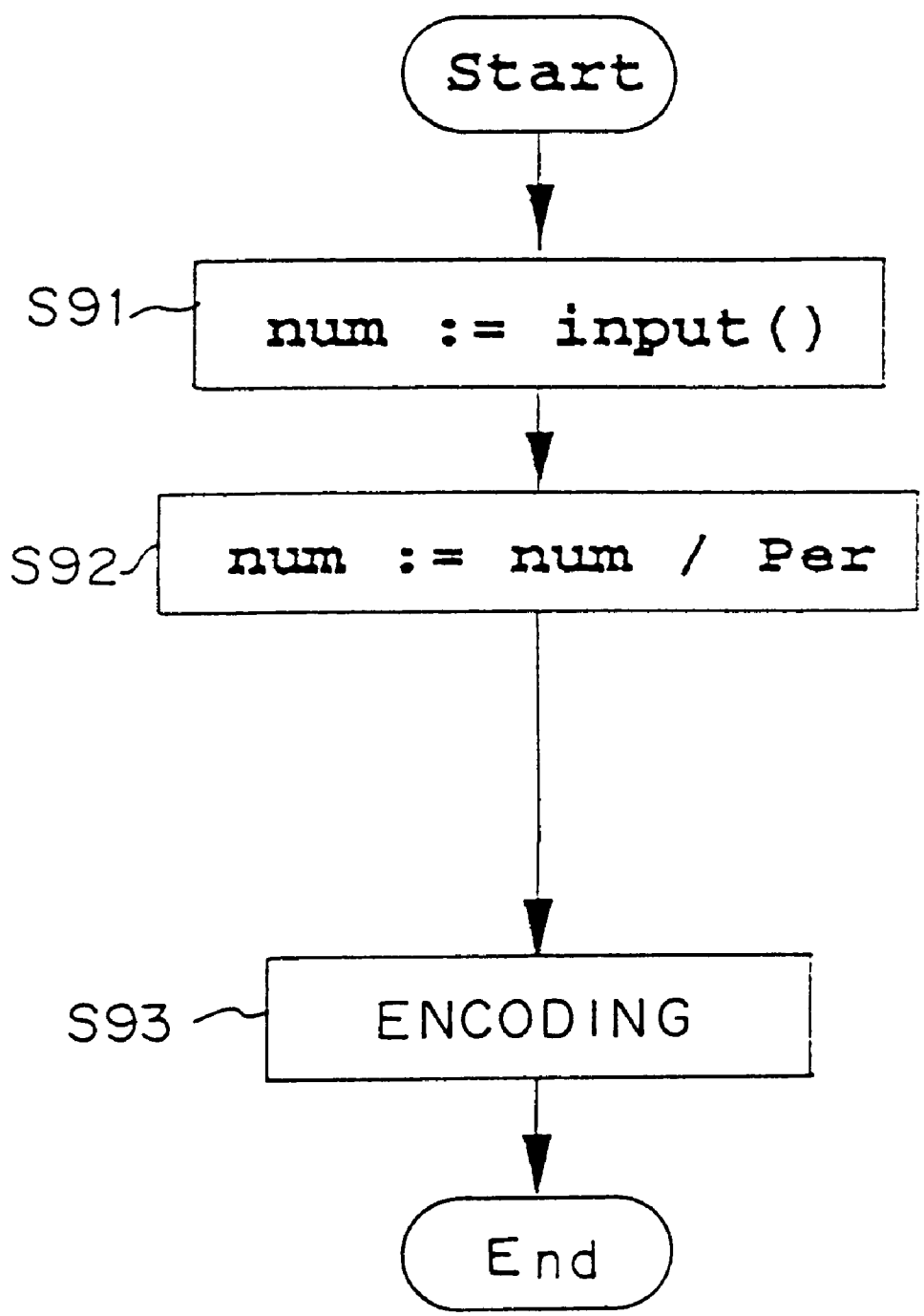
FIG. 25 is a flow chart of a Per encoding process.

FIG. 25 is the flow chart of a Per coding process. When the process has been started, the information retrieval system first reads original data and sets it in a variable "num" (step S91), and it divides the original data by a predetermined denominator value "Per" (step S92).

The value "Per" to be used in the division should preferably be selected from among values to which shift instructions of high-speed execution are available. Any of values, for example, 2, 4, 8, 16, 32 and 64 is used as the "Per". Here, the fraction of a resulting quotient below the decimal point thereof is discarded, and the integer part of the quotient is set as the interim numerical value, which is substituted into the "num" anew.

The value of the "num" is subsequently encoded (step S93), whereupon the process is ended. At step S93, any desired coding scheme can be employed. However, in the case of employing the coding scheme which cannot express "0", for example, the B24 coding, the measure shall be taken that, when the "num" obtained at step S92 is "0", "1" is added thereto, followed by the encoding at step S93.

There will now be explained an example in the case of employing the B24 coding as the encoding method at step S93. Here, the numerical value of 21 mentioned before is encoded in accordance with the following steps by "Per(2) coding" having a denominator value "2", and the corresponding code "11000011" is obtained:

1. "21" is divided by "2", and the fraction of a quotient below the decimal point thereof is discarded. Thus, the "num"=10 holds (step S92).

2. Since I2(10)+2=3 holds, the continuation flag becomes "3" (step S67 in FIG. 19).

3. The continuation flag "3" is set in the variable "Bitbuf" in terms of the unary code "110" (step S67).

4. The bit pattern "00011" of the ("Value"-7)=10-7=3 is set in the "Bitbuf" so as to succeed the continuation flag (step S67).

Figure 26:
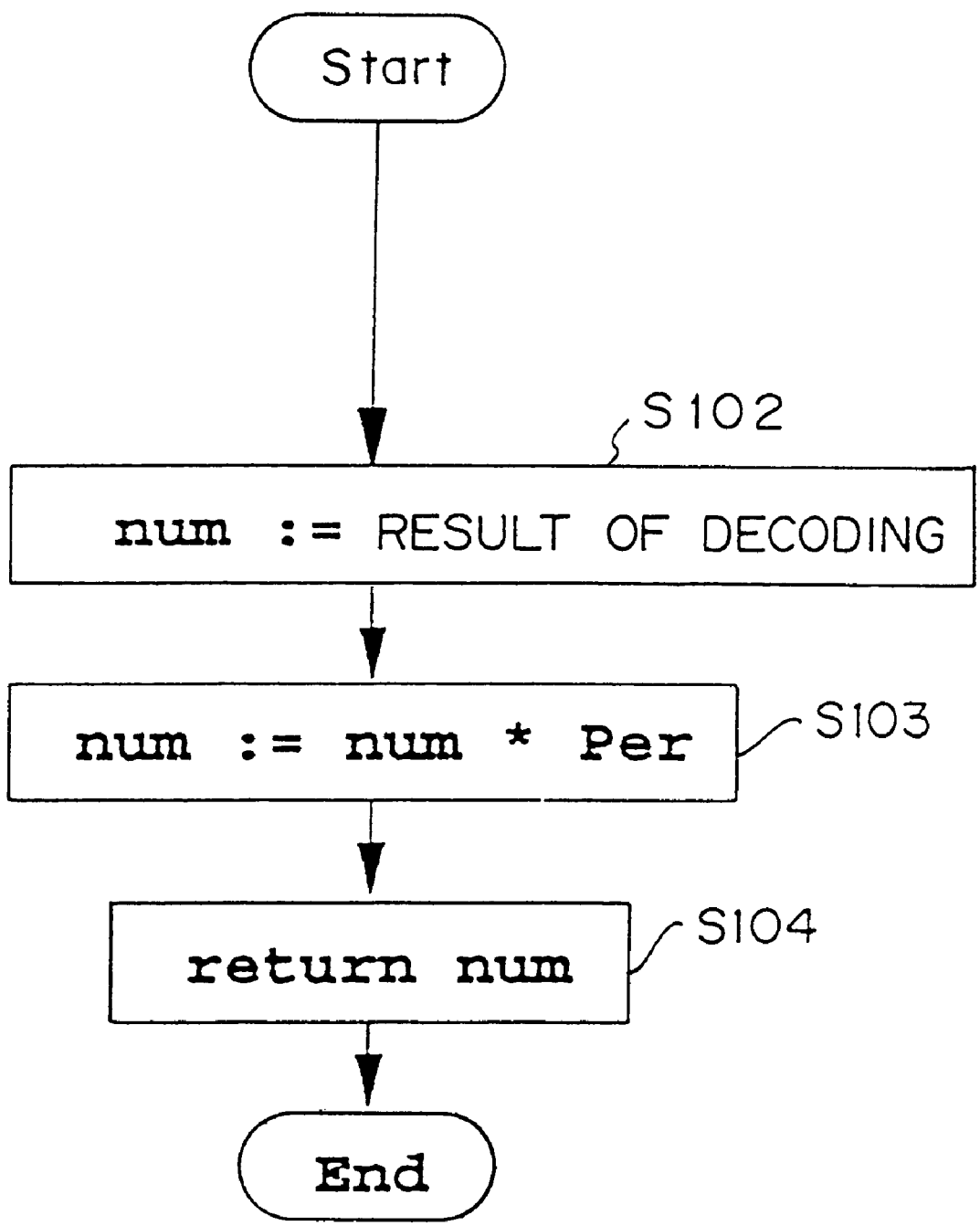
FIG. 26 is a flow chart of a Per decoding process.

Next, FIG. 26 is the flow chart of a "Per" decoding process. When the process has been started, the information retrieval system first decodes a "Per" code and sets the resulting numerical value in the variable "num" (step S102). At step S102, it is conditioned to employ a decoding method which corresponds to the encoding method used at step S93 in FIG. 25. Subsequently, the "num" is multiplied by the above denominator value "Per" (step S103), and the resulting product is returned to a program being a calling source (step S104). Thereafter, the process is ended.

In general, numerical data obtained by the "Per decoding" does not always agree with original data. By way of example, when the code "11000011", corresponding to the above numerical value "21", is decoded by the B24 decoding process, the numerical value "10" is obtained (step S102). However, when this numerical value "10" is multiplied by the "Per"=2, the "num"=20 holds (step S103), and the original numerical value "21" is not restored. The "Per coding" is accordingly effective for a case where the approximate values of original data may be reproduced, as in the case of the "occurring positions of a word within a document".

Any of the coding schemes which are used for compressing indices, expresses smaller numerical values with smaller numbers of bits and larger numerical values with larger numbers of bits. According to the "Per coding", a larger numerical value is changed into a smaller numerical value, which is subsequently encoded. Therefore, the effect of compression can be expected to that extent.

Meanwhile, an index structure which includes information on the "occurring positions of a word within a document" becomes as indicated by [Document No., Number of Occurrences of Word within Document, Number of Areas of Occurring positions of Word within Document, Occurring positions of Word within Document, . . . ,]. Here, the "number of areas of the occurring positions of the word within the document" bears the size of the data areas of the succeeding "occurring positions of the word within the document".

The information of "document No." can be expressed by the difference between the particular document No. and the document No. of the preceding set. Also, the information of the "occurring positions of the word within the document" can be expressed by the difference between the particular position and the preceding "occurring position of the word within the document" within the identical document. The "numbers of occurrences of the word within the documents" or the "numbers of areas of the occurring positions of the word within the documents", however, cannot have their difference values taken because they are not arranged from a smaller numerical value toward a larger numerical value in sequence.

In a conventional information retrieval system, the "number of areas of the occurring positions of the word within the document" is described in bit units. With the encoding method of the present invention, however, the number of bits of the smallest block is 2 bits or 4 bits, and hence, the "number of areas of the occurring positions of the word within the document" can be described in smallest-block units.

For example if 200 bits are required for expressing the information of the occurring position of a certain key. Then, whereas the information is expressed by a numerical value "200" in bit units, it is expressed by a numerical value "100" in 2-bit units, and it is expressed by a numerical value "50" in 4-bit units. Since the "number of areas of the occurring positions of the word within the document" is encoded together with the other numerical values, enhancement in the compressibility of an index size can be expected by expressing this "number of areas" by a smaller numerical value.

Further, an index structure in the case of substituting the "number of occurrences of the word within the document" for the "number of areas of the occurring positions of the word within the document" becomes as indicated by [Document No., Number of Occurrences of Word within Document, Occurring positions of Word within Document, . . . ,]. Here, the "number of occurrences of the word within the document" represents the number of the succeeding "occurring positions of the word within the document".

In this case, however, all the "occurring positions of the word within the document" behind the "number of occurrences of the word within the document" must be decoded in order to fetch the "document No." of the succeeding set. In contrast, in the case where the "number of areas of the occurring positions of the word within the document" is additionally provided, the "occurring positions of the word within the document" need not be decoded, but a location which is distant from the number of bits computed from the above "number of areas" may be accessed.

Now, examples of index structures in which the encoding methods, elucidated before, are adopted in combination will be described with reference to FIGS. 27 through 41. The structures of indices shall have the following five formats in accordance with the uses thereof:

First index structure: [Document No.]

Second index structure: [Document No., Number of Occurrences of Word within Document]

Third index structure: [Document No., Number of Occurrences of Word within Document, Occurring positions of Word within Document, . . . ,]

Fourth index structure: [Document No., Number of Areas of Occurring positions of Word within Document, Occurring positions of Word within Document, . . . ,]

Fifth index structure: [Document No., Number of Occurrences of Word within Document, Number of Areas of Occurring positions of Word within Document, Occurring positions of Word within Document, . . . ,]

By way of example, when the index structure shown in FIG. 3 is rewritten using the fifth index structure, it is expressed as shown in FIG. 27. Here, each position designated by mark '?' bears the "number of areas of the occurring positions of a word within a document". In the ensuing examples, numerical values indicated in FIG. 27 will be used as original data, and they will be represented by decimal numbers.

FIG. 28 tabulates bit patterns and the total numbers of bits of individual codes in the advanced 4BB coding and the B24 coding in the case of employing the first index structure. Since the first index structure consists only of the "document No.", the "Per coding" is not applied.

FIG. 29 tabulates the bit patterns and the total numbers of bits of codes in the case of employing the second index structure. Here, "Per(2) coding" is applied to only the "number of occurrences of a word within a document", and the integer part of ("number of occurrences of a word within a document"/2) is encoded. However, in a case where the integer part becomes "0", a numerical value "1" is encoded instead.

Besides, in encoding the "document No." and the "number of occurrences of a word within a document", various combinations of the encoding methods described before are considered. Here in FIG. 29, encoded results are listed as to the following six combinations:

1. Document No.: Advanced 4BB, Number of Occurrences of Word within Document: Advanced 4BB (Combination #1 in FIG. 29)
2. Document No.: Advanced 4BB, Number of Occurrences of Word within Document: Advanced 4BB+Per(2) (Combination #2 in FIG. 29)
3. Document No.: Advanced 4BB, Number of Occurrences of Word within Document: B24+Per(2) (Combination #3 in FIG. 29)
4. Document No.: B24, Number of Occurrences of Word within Document: Advanced 4BB (Combination #4 in FIG. 29)
5. Document No.: B24, Number of Occurrences of Word within Document: Advanced 4BB+Per(2) (Combination #5 in FIG. 29)
6. Document No.: B24, Number of Occurrences of Word within Document: B24+Per(2) (Combination #6 in FIG. 29)

FIGS. 30, 31 and 32 tabulate the bit patterns and the total numbers of bits of codes in the case of employing the third index structure. Here, "Per(16) coding" is applied to only the "occurring positions of a word within a document", and the integer part of ("number of occurrences of a word within a document"/16) is encoded. However, in a case where the integer part becomes "0", a numerical value "1" is encoded instead.

In the case of the third index structure, the number of the "occurring positions of a word within a document" is equal to the "number of occurrences of a word within a document", and it is accordingly impossible to apply the "Per coding" to only the "number of occurrences of a word within a document" Therefore, encoded results are listed as to the following twenty-four combinations:

1. Document No.: Advanced 4BB, Number of Occurrences of Word within Document: Advanced 4BB, Occurring positions of Word within Document: Advanced 4BB (Combination #1 in FIG. 30)
2. Document No.: Advanced 4BB, Number of Occurrences of Word within Document: Advanced 4BB, Occurring positions of Word within Document: Advanced 4BB+Per(16) (Combination #2 in FIG. 30)
3. Document No.: Advanced 4BB, Number of Occurrences of Word within Document: Advanced 4BB, Occurring positions of Word within Document: B24 (Combination #3 in FIG. 30)
4. Document No.: Advanced 4BB, Number of Occurrences of Word within Document: Advanced 4BB, Occurring positions of Word within Document: B24+Per(16) (Combination #4 in FIG. 30)
5. Document No.: Advanced 4BB, Number of Occurrences of Word within Document: B24, Occurring positions of Word within Document: Advanced 4BB (Combination #5 in FIG. 30)
6. Document No.: Advanced 4BB, Number of Occurrences of Word within Document: B24, Occurring positions of Word within Document: Advanced 4BB+Per(16) (Combination #6 in FIG. 30)
7. Document No.: Advanced 4BB, Number of Occurrences of Word within Document: B24, Occurring positions of Word within Document: B24 (Combination #7 in FIG. 30)
8. Document No.: Advanced 4BB, Number of Occurrences of Word within Document: B24, Occurring positions of Word within Document: B24+Per(16) (Combination #8 in FIG. 30)
9. Document No.: B24, Number of Occurrences of Word within Document: Advanced 4BB, Occurring positions of Word within Document: Advanced 4BB (Combination #9 in FIG. 31)
10. Document No.: B24, Number of Occurrences of Word within Document: Advanced 4BB, Occurring positions of Word within Document: Advanced 4BB+Per(16) (Combination #10 in FIG. 31)
11. Document No.: B24, Number of Occurrences of Word within Document: Advanced 4BB, Occurring positions of Word within Document: B24 (Combination #11 in FIG. 31)
12. Document No.: B24, Number of Occurrences of Word within Document: Advanced 4BB, Occurring positions of Word within Document: B24+Per(16) (Combination #12 in FIG. 31)
13. Document No.: B24, Number of Occurrences of Word within Document: B24, Occurring positions of Word within Document: Advanced 4BB (Combination #13 in FIG. 31)
14. Document No.: B24, Number of Occurrences of Word within Document: B24, Occurring positions of Word within Document: Advanced 4BB+Per(16) (Combination #14 in FIG. 31)
15. Document No.: B24, Number of Occurrences of Word within Document: B24, Occurring positions of Word within Document: B24 (Combination #15 in FIG. 31)
16. Document No.: B24, Number of Occurrences of Word within Document: B24, Occurring positions of Word within Document: B24+Per(16) (Combination #16 in FIG. 31)
17. Document No.: Advanced 4BB, Number of Occurrences of Word within Document: Advanced 4BB, Occurring positions of Word within Document: 84BB (Combination #17 in FIG. 32)
18. Document No.: Advanced 4BB, Number of Occurrences of Word within Document: Advanced 4BB, Occurring positions of Word within Document: 84BB+Per(16) (Combination #18 in FIG. 32)
19. Document No.: Advanced 4BB, Number of Occurrences of Word within Document: B24, Occurring positions of Word within Document: 84BB (Combination #19 in FIG. 32)
20. Document No.: Advanced 4BB, Number of Occurrences of Word within Document: B24, Occurring positions of Word within Document: 84BB+Per(16) (Combination #20 in FIG. 32)
21. Document No.: B24, Number of Occurrences of Word within Document: Advanced 4BB, Occurring positions of Word within Document: 84BB (Combination #21 in FIG. 32)
22. Document No.: B24, Number of Occurrences of Word within Document: Advanced 4BB, Occurring positions of Word within Document: 84BB+Per(16) (Combination #22 in FIG. 32)
23. Document No.: B24, Number of Occurrences of Word within Document: B24, Occurring positions of Word within Document: 84BB (Combination #23 in FIG. 32)
24. Document No.: B24, Number of Occurrences of Word within Document: B24, Occurring positions of Word within Document: 84BB+Per(16) (Combination #24 in FIG. 32)

FIGS. 33, 34 and 35 tabulate the bit patterns and the total numbers of bits of codes in the case of employing the fourth index structure. Here, "Per(16) coding" is applied to only the "occurring positions of a word within a document", and the integer part of ("number of occurrences of a word within a document"/16) is encoded. However, in a case where the integer part becomes "0", a numerical value "1" is encoded instead.

In the case of encoding the "occurring positions of a word within a document" by the advanced 4BB coding, the unit of the "number of areas of the occurring positions of a word within a document" becomes 4 bits, and in the case of encoding the "occurring positions" by the B24 coding, the unit of the "number of areas" becomes 2 bits. The numbers of bits within ( ) in the column of coding schemes denotes the sizes of the unit blocks, and numerical values within ( ) on the right sides of the individual bit patterns denote decimal numbers corresponding to the bit patterns. Here, encoded results are listed as to the following twenty-four combinations:

1. Document No.: Advanced 4BB, Number of Areas of Occurring positions of Word within Document: Advanced 4BB, Occurring positions of Word within Document: Advanced 4BB (Combination #1 in FIG. 33)

2. Document No.: Advanced 4BB, Number of Areas of Occurring positions of Word within Document: Advanced 4BB, Occurring positions of Word within Document: Advanced 4BB+Per(16) (Combination #2 in FIG. 33)

3. Document No.: Advanced 4BB, Number of Areas of Occurring positions of Word within Document: Advanced 4BB, Occurring positions of Word within Document: B24 (Combination #3 in FIG. 33)

4. Document No.: Advanced 4BB, Number of Areas of Occurring positions of Word within Document: Advanced 4BB, Occurring positions of Word within Document: B24+Per(16) (Combination #4 in FIG. 33)

5. Document No.: Advanced 4BB, Number of Areas of Occurring positions of Word within Document: B24, Occurring positions of Word within Document: Advanced 4BB (Combination #5 in FIG. 33)

6. Document No.: Advanced 4BB, Number of Areas of Occurring positions of Word within Document: B24, Occurring positions of Word within Document: Advanced 4BB+Per(16) (Combination #6 in FIG. 33)

7. Document No.: Advanced 4BB, Number of Areas of Occurring positions of Word within Document: B24, Occurring positions of Word within Document: B24 (Combination #7 in FIG. 33)

8. Document No.: Advanced 4BB, Number of Areas of Occurring positions of Word within Document: B24, Occurring positions of Word within Document: B24+Per(16) (Combination #8 in FIG. 33)

9. Document No.: Advanced 4BB, Number of Areas of Occurring positions of Word within Document: Advanced 4BB, Occurring positions of Word within Document: Advanced 4BB (Combination #9 in FIG. 34)

10. Document No.: B24, Number of Areas of Occurring positions of Word within Document: Advanced 4BB, Occurring positions of Word within Document: Advanced 4BB+Per(16) (Combination #10 in FIG. 34)

11. Document No.: B24, Number of Areas of Occurring positions of Word within Document: Advanced 4BB, Occurring positions of Word within Document: B24 (Combination #11 in FIG. 34)

12. Document No.: B24, Number of Areas of Occurring positions of Word within Document: Advanced 4BB, Occurring positions of Word within Document: B24+Per(16) (Combination #12 in FIG. 34)

13. Document No.: B24, Number of Areas of Occurring positions of Word within Document: B24, Occurring positions of Word within Document: Advanced 4BB (Combination #13 in FIG. 34)

14. Document No.: B24, Number of Areas of Occurring positions of Word within Document: B24, Occurring positions of Word within Document: Advanced 4BB+Per(16) (Combination #14 in FIG. 34)

15. Document No.: B24, Number of Areas of Occurring positions of Word within Document: B24, Occurring positions of Word within Document: B24 (Combination #15 in FIG. 34)

16. Document No.: B24, Number of Areas of Occurring positions of Word within Document: B24, Occurring positions of Word within Document: B24+Per(16) (Combination #16 in FIG. 34)

17. Document No.: Advanced 4BB, Number of Areas of Occurring positions of Word within Document: Advanced 4BB, Occurring positions of Word within Document: 84BB (Combination #17 in FIG. 35)

18. Document No.: Advanced 4BB, Number of Areas of Occurring positions of Word within Document: Advanced 4BB, Occurring positions of Word within Document: 84BB+Per(16) (Combination #18 in FIG. 35)

19. Document No.: Advanced 4BB, Number of Areas of Occurring positions of Word within Document: B24, Occurring positions of Word within Document: 84BB (Combination #19 in FIG. 35)

20. Document No.: Advanced 4BB, Number of Areas of Occurring positions of Word within Document: B24, Occurring positions of Word within Document: 84BB+Per(16) (Combination #20 in FIG. 35)

21. Document No.: B24, Number of Areas of Occurring positions of Word within Document: Advanced 4BB, Occurring positions of Word within Document: 84BB (Combination #21 in FIG. 35)

22. Document No.: B24, Number of Areas of Occurring positions of Word within Document: Advanced 4BB, Occurring positions of Word within Document: 84BB+Per(16) (Combination #22 in FIG. 35)

23. Document No.: B24, Number of Areas of Occurring positions of Word within Document: B24, Occurring positions of Word within Document: 84BB (Combination #23 in FIG. 35)

24. Document No.: B24, Number of Areas of Occurring positions of Word within Document: B24, Occurring positions of Word within Document: 84BB+Per(16) (Combination #24 in FIG. 35)

FIGS. 36, 37, 38, 39, 40 and 41 tabulate the bit patterns and the total numbers of bits of codes in the case of employing the fifth index structure. Here, "Per(16) coding" is applied to only the "occurring positions of a word within a document", and the integer part of ("number of occurrences of a word within a document"/16) is encoded. However, in a case where the integer part becomes "0", a numerical value "1" is encoded instead.

The numbers of bits within ( ) in the column of coding schemes denotes the sizes of the units of the "number of areas of the occurring positions of a word within a document", and numerical values within ( ) on the right sides of the individual bit patterns denote decimal numbers corresponding to the bit patterns. Here, encoded results are listed as to the following forty-eight combinations:

1. Document No.: Advanced 4BB, Number of Occurrences of Word within Document: Advanced 4BB, Number of Areas of Occurring positions of Word within Document: Advanced 4BB, Occurring positions of Word within Document: Advanced 4BB (Combination #1 in FIG. 36)

2. Document No.: Advanced 4BB, Number of Occurrences of Word within Document: Advanced 4BB, Number of Areas of Occurring positions of Word within Document: Advanced 4BB, Occurring positions of Word within Document: Advanced 4BB+Per(16) (Combination #2 in FIG. 36)

3. Document No.: Advanced 4BB, Number of Occurrences of Word within Document: Advanced 4BB, Number of Areas of Occurring positions of Word within Document: Advanced 4BB, Occurring positions of Word within Document: B24 (Combination #3 in FIG. 36)

4. Document No.: Advanced 4BB, Number of Occurrences of Word within Document: Advanced 4BB, Number of Areas of Occurring positions of Word within Document: Advanced 4BB, Occurring positions of Word within Document: B24+Per(16) (Combination #4 in FIG. 36)

5. Document No.: Advanced 4BB, Number of Occurrences of Word within Document: Advanced 4BB, Number of Areas of Occurring positions of Word within Document: B24, Occurring positions of Word within Document: Advanced 4BB (Combination #5 in FIG. 36)

6. Document No.: Advanced 4BB, Number of Occurrences of Word within Document: Advanced 4BB, Number of Areas of Occurring positions of Word within Document: B24, Occurring positions of Word within Document: Advanced 4BB+Per(16) (Combination #6 in FIG. 36)

7. Document No.: Advanced 4BB, Number of Occurrences of Word within Document: Advanced 4BB, Number of Areas of Occurring positions of Word within Document: B24, Occurring positions of Word within Document: B24 (Combination #7 in FIG. 36)

8. Document No.: Advanced 4BB, Number of Occurrences of Word within Document: Advanced 4BB, Number of Areas of Occurring positions of Word within Document: B24, Occurring positions of Word within Document: B24+Per(16) (Combination #8 in FIG. 36)

9. Document No.: Advanced 4BB, Number of Occurrences of Word within Document: B24, Number of Areas of Occurring positions of Word within Document: Advanced 4BB, Occurring positions of Word within Document: Advanced 4BB (Combination #9 in FIG. 37)

10. Document No.: Advanced 4BB, Number of Occurrences of Word within Document: B24, Number of Areas of Occurring positions of Word within Document: Advanced 4BB, Occurring positions of Word within Document: Advanced 4BB+Per(16) (Combination #10 in FIG. 37)

11. Document No.: Advanced 4BB, Number of Occurrences of Word within Document: B24, Number of Areas of Occurring positions of Word within Document: Advanced 4BB, Occurring positions of Word within Document: B24 (Combination #11 in FIG. 37)

12. Document No.: Advanced 4BB, Number of Occurrences of Word within Document: B24, Number of Areas of Occurring positions of Word within Document: Advanced 4BB, Occurring positions of Word within Document: B24+Per(16) (Combination #12 in FIG. 37)

13. Document No.: Advanced 4BB, Number of Occurrences of Word within Document: B24, Number of Areas of Occurring positions of Word within Document: B24, Occurring positions of Word within Document: Advanced 4BB (Combination #13 in FIG. 37)

14. Document No.: Advanced 4BB, Number of Occurrences of Word within Document: B24, Number of Areas of Occurring positions of Word within Document: B24, Occurring positions of Word within Document: Advanced 4BB+Per(16) (Combination #14 in FIG. 37)

15. Document No.: Advanced 4BB, Number of Occurrences of Word within Document: B24, Number of Areas of Occurring positions of Word within Document: B24, Occurring positions of Word within Document: B24 (Combination #15 in FIG. 37)

16. Document No.: Advanced 4BB, Number of Occurrences of Word within Document: B24, Number of Areas of Occurring positions of Word within Document: B24, Occurring positions of Word within Document: B24+Per(16) (Combination #16 in FIG. 37)

17. Document No.: B24, Number of Occurrences of Word within Document: Advanced 4BB, Number of Areas of Occurring positions of Word within Document: Advanced 4BB, Occurring positions of Word within Document: Advanced 4BB (Combination #17 in FIG. 38)

18. Document No.: B24, Number of Occurrences of Word within Document: Advanced 4BB, Number of Areas of Occurring positions of Word within Document: Advanced 4BB, Occurring positions of Word within Document: Advanced 4BB+Per(16) (Combination #18 in FIG. 38)

19. Document No.: B24, Number of Occurrences of Word within Document: Advanced 4BB, Number of Areas of Occurring positions of Word within Document: Advanced 4BB, Occurring positions of Word within Document: B24 (Combination #19 in FIG. 38)

20. Document No.: B24, Number of Occurrences of Word within Document: Advanced 4BB, Number of Areas of Occurring positions of Word within Document: Advanced 4BB, Occurring positions of Word within Document: B24+Per(16) (Combination #20 in FIG. 38)

21. Document No.: B24, Number of Occurrences of Word within Document: Advanced 4BB, Number of Areas of Occurring positions of Word within Document: B24, Occurring positions of Word within Document: Advanced 4BB (Combination #21 in FIG. 38)

22. Document No.: B24, Number of Occurrences of Word within Document: Advanced 4BB, Number of Areas of Occurring positions of Word within Document: B24, Occurring positions of Word within Document: Advanced 4BB+Per(16) (Combination #22 in FIG. 38)

23. Document No.: B24, Number of Occurrences of Word within Document: Advanced 4BB, Number of Areas of Occurring positions of Word within Document: B24, Occurring positions of Word within Document: B24 (Combination #23 in FIG. 38)

24. Document No.: B24, Number of Occurrences of Word within Document: Advanced 4BB, Number of Areas of Occurring positions of Word within Document: B24, Occurring positions of Word within Document: B24+Per(16) (Combination #24 in FIG. 38)

25. Document No.: B24, Number of Occurrences of Word within Document: B24, Number of Areas of Occurring positions of Word within Document: Advanced 4BB, Occurring positions of Word within Document: Advanced 4BB (Combination #25 in FIG. 39)

26. Document No.: B24, Number of Occurrences of Word within Document: B24, Number of Areas of Occurring positions of Word within Document: Advanced 4BB, Occurring positions of Word within Document: Advanced 4BB+Per(16) (Combination #26 in FIG. 39)

27. Document No.: B24, Number of Occurrences of Word within Document: B24, Number of Areas of Occurring positions of Word within Document: Advanced 4BB, Occurring positions of Word within Document: B24 (Combination #27 in FIG. 39)

28. Document No.: B24, Number of Occurrences of Word within Document: B24, Number of Areas of Occurring positions of Word within Document: Advanced 4BB, Occurring positions of Word within Document: B24+Per(16) (Combination #28 in FIG. 39)

29. Document No.: B24, Number of Occurrences of Word within Document: B24, Number of Areas of Occurring positions of Word within Document: B24, Occurring positions of Word within Document: Advanced 4BB (Combination #29 in FIG. 39)

30. Document No.: B24, Number of Occurrences of Word within Document: B24, Number of Areas of Occurring positions of Word within Document: B24, Occurring positions of Word within Document: Advanced 4BB+Per(16) (Combination #30 in FIG. 39)

31. Document No.: B24, Number of Occurrences of Word within Document: B24, Number of Areas of Occurring positions of Word within Document: B24, Occurring positions of Word within Document: B24 (Combination #31 in FIG. 39)

32. Document No.: B24, Number of Occurrences of Word within Document: B24, Number of Areas of Occurring positions of Word within Document: B24, Occurring positions of Word within Document: B24+Per(16) (Combination #32 in FIG. 39)

33. Document No.: Advanced 4BB, Number of Occurrences of Word within Document: Advanced 4BB, Number of Areas of Occurring positions of Word within Document: Advanced 4BB, Occurring positions of Word within Document: 84BB (Combination #33 in FIG. 40)

34. Document No.: Advanced 4BB, Number of Occurrences of Word within Document: Advanced 4BB, Number of Areas of Occurring positions of Word within Document: Advanced 4BB, Occurring positions of Word within Document: 84BB+Per(16) (Combination #34 in FIG. 40)

35. Document No.: Advanced 4BB, Number of Occurrences of Word within Document: Advanced 4BB, Number of Areas of Occurring positions of Word within Document: B24, Occurring positions of Word within Document: 84BB (Combination #35 in FIG. 40)

36. Document No.: Advanced 4BB, Number of Occurrences of Word within Document: Advanced 4BB, Number of Areas of Occurring positions of Word within Document: B24, Occurring positions of Word within Document: 84BB+Per(16) (Combination #36 in FIG. 40)

37. Document No.: Advanced 4BB, Number of Occurrences of Word within Document: B24, Number of Areas of Occurring positions of Word within Document: Advanced 4BB, Occurring positions of Word within Document: 84BB (Combination #37 in FIG. 40)

38. Document No.: Advanced 4BB, Number of Occurrences of Word within Document: B24, Number of Areas of Occurring positions of Word within Document: Advanced 4BB, Occurring positions of Word within Document: 84BB+Per(16) (Combination #38 in FIG. 40)

39. Document No.: Advanced 4BB, Number of Occurrences of Word within Document: B24, Number of Areas of Occurring positions of Word within Document: B24, Occurring positions of Word within Document: 84BB (Combination #39 in FIG. 40)

40. Document No.: Advanced 4BB, Number of Occurrences of Word within Document: B24, Number of Areas of Occurring positions of Word within Document: B24, Occurring positions of Word within Document: 84BB+Per(16) (Combination #40 in FIG. 40)

41. Document No.: B24, Number of Occurrences of Word within Document: Advanced 4BB, Number of Areas of Occurring positions of Word within Document: Advanced 4BB, Occurring positions of Word within Document: 84BB (Combination #41 in FIG. 41)

42. Document No.: B24, Number of Occurrences of Word within Document: Advanced 4BB, Number of Areas of Occurring positions of Word within Document: Advanced 4BB, Occurring positions of Word within Document: 84BB+Per(16) (Combination #42 in FIG. 41)

43. Document No.: B24, Number of Occurrences of Word within Document: Advanced 4BB, Number of Areas of Occurring positions of Word within Document: B24, Occurring positions of Word within Document: 84BB (Combination #43 in FIG. 41)

44. Document No.: B24, Number of Occurrences of Word within Document: Advanced 4BB, Number of Areas of Occurring positions of Word within Document: B24, Occurring positions of Word within Document: 84BB+Per(16) (Combination #44 in FIG. 41)

45. Document No.: B24, Number of Areas of Occurring within Document: B24, Number of Areas of Occurring positions of Word within Document: Advanced 4BB, Occurring positions of Word within Document: 84BB (Combination #45 in FIG. 41)

46. Document No.: B24, Number of Occurrences of Word within Document: B24, Number of Areas of Occurring positions of Word within Document: Advanced 4BB, Occurring positions of Word within Document: 84BB+Per(16) (Combination #46 in FIG. 41)

47. Document No.: B24, Number of Occurrences of Word within Document: B24, Number of Areas of Occurring positions of Word within Document: B24, Occurring positions of Word within Document: 84BB (Combination #47 in FIG. 41)

48. Document No.: B24, Number of Occurrences of Word within Document: B24, Number of Areas of Occurring positions of Word within Document: B24, Occurring positions of Word within Document: 84BB+Per(16) (Combination #48 in FIG. 41)

In the foregoing aspects of performance, the data compression/expansion apparatuses of the present invention is applied to the information retrieval system. However, the data compression/expansion apparatuses are not restricted to only indices for retrieval, but they can be used for the compression/expansion of any desired data.

What is claimed is:

1. A data compression apparatus comprising:
a compression device compressing given data according to a block-based coding method, and generating continuation flag information expressive of a length of compressed data in block units at a top part of the compressed data; and
a storage device storing said compressed data.

2. A data compression apparatus according to claim 1, wherein said compression device compresses numerical data for use in an index for information retrieval.

3. A data compression apparatus according to claim 2, wherein said compression device compresses at least one numerical data among "document No." data, "number of occurrences of a word within a document" data, "occurring position of a word within a document" data, and data expressive of a size of an area of the "occurring position of a word within a document" data.

4. A data compression apparatus according to claim 3, wherein at least one of the "document No." data and said "occurring position of a word within a document" data expresses difference information.

5. A data compression apparatus according to claim 1, wherein said compression device generates the continuation flag information expressive of a block length of said compressed data at the top part of said compressed data of at least one block, and generates data expressive of given data so as to succeed said continuation flag information.

6. A data compression apparatus according to claim 5, wherein said compression device includes an encoding device encoding said given data with 4 bits as a unit of the block.

7. A data compression apparatus according to claim 5, wherein said compression device includes an encoding device encoding given numerical data of at most 127 with a block of 8 bits, and encoding given numerical data of at least 128 with a top block of 8 bits and at least one succeeding block having 4 bits as a unit thereof.

8. A data compression apparatus according to claim 7, wherein said encoding device expresses numerical data of at most 127 by "0" of one bit and a bit pattern of 7 bits.

9. A data compression apparatus according to claim 5, wherein said compression device includes an encoding device encoding given numerical data of at most 2 with a block of 2 bits, and encoding given numerical data of at least 3 with 4 bits as a unit of the block.

10. A data compression apparatus according to claim 9, wherein said encoding device expresses given numerical data of at least 3 and at most 6 by the continuation flag information of 2 bits and a bit pattern of 2 bits.

11. A data compression apparatus comprising:
a conversion device converting numerical data to use in an index for information retrieval into interim numerical data expressive of a smaller numerical value;
a compression device compressing the interim numerical data by coding the interim numerical data; and
a storage device storing the compressed data.

12. A data compression apparatus according to claim 11, wherein said compression device compresses at least one numerical data between "number of occurrences of a word within a document" data and "occurring position of a word within a document" data for use in an index for information retrieval.

13. A data compression apparatus according to claim 11, wherein said compression device compresses the interim numerical data with 4 bits as a unit of a block, and generates continuation flag information expressive of a block length of said compressed data at a top part of said compressed data.

14. A data compression apparatus according to claim 11, wherein said compression device expresses the interim numerical data by expressing a numerical value of at most 2, by a block of 2 bits, and compresses the interim numerical data expressing a numerical value of at least 3, with 4 bits as a unit of a block.

15. A data compression apparatus according to claim 14, wherein said compression device expresses given numerical data of at least 3 and at most 6 by continuation flag information of 2 bits and a bit pattern of 2 bits.

16. A data compression apparatus comprising:
a compression device describing size data in block units, the size data expressing a size of an area of "occurring position of a word within a document" data for use in an index for information retrieval, and for compressing said size data; and
a storage device storing the compressed size data therein.

17. A data expansion apparatus comprising:
a storage device storing therein data compressed in block units according to a block-based coding method; and
an expansion device determining a length of the compressed data based on continuation flag information at a top part of said compressed data, and then restoring original data.

18. A data expansion apparatus according to claim 17, wherein said expansion device restores numerical data for use in an index for information retrieval.

19. A data expansion apparatus according to claim 18, wherein said expansion device restores at least one numerical data among "document No." data, "number of occurrences of a word within a document" data, "occurring position of a word within a document" data, and data expressive of a size of an area of the "occurring position of a word within a document" data.

20. A data expansion apparatus according to claim 17, wherein said expansion device derives data expressive of the original data succeeding the continuation flag information, on the basis of said continuation flag information expressive of a block length of said compressed data of at least one block, and then restores said original data.

21. A data expansion apparatus according to claim 20, wherein said expansion device includes a decoding device decoding a code given as said compressed data and described with 4 bits as a unit of a block.

22. A data expansion apparatus according to claim 20, wherein said expansion device includes a decoding device decoding one block of 8 bits given as said compressed data, to generate numerical data of at most 127, and decoding a top block of 8 bits and at least one succeeding block having 4 bits as a unit thereof, the blocks having been given as said compressed data, thereby to generate numerical data of at least 128.

23. A data expansion apparatus according to claim 22, wherein said decoding device generates the numerical data of at most 127 when said one block of 8 bits is composed of "0" of one bit and a bit pattern of 7 bits.

24. A data expansion apparatus according to claim 20, wherein said expansion device includes a decoding device decoding one block of 2 bits given as said compressed data, thereby to generate numerical data of at most 2, and for decoding at least one block having 4 bits as a unit thereof and given as said compressed data, thereby to generate numerical data of at least 3.

25. A data expansion apparatus according to claim 24, wherein said decoding device generates numerical data of at least 3 and at most 6 when said compressed data is composed of said continuation flag information of 2 bits and a bit pattern of 2 bits.

26. A data expansion apparatus comprising:
a storage device converting numerical data for use in an index for information retrieval into interim numerical data expressive of a smaller numerical value, compressing the interim numerical data and storing the compressed numerical data therein; and
an expansion device expanding said compressed numerical data and converting the expanded numerical data into a larger numerical value.

27. A data expansion apparatus comprising:
a storage device compressing size data which describes in block units a size of an area of "occurring position of a word within a document" data for use in an index for information retrieval, and storing the compressed size data therein; and
an expansion device restoring said size data.

28. An information retrieval system comprising:
a storage device compressing, according to a block-based coding method, numerical data for use in an index for information retrieval, and storing compressed data in block units therein;
an expansion device determining a length of said compressed data on the basis of continuation flag information at a top part of said compressed data, and then restoring the original data; and a retrieval device retrieving a database by use of said original data restored.

29. An information retrieval system comprising:

a storage device converting numerical data for use in an index for information retrieval into interim numerical data expressive of a smaller numerical value, compressing the interim numerical data and storing the compressed numerical data therein;

an expansion device expanding said compressed numerical data and converting the expanded numerical data into a larger numerical value; and a retrieval device retrieving a database by the use of the larger numerical value.

30. An information retrieval system comprising:

a storage device compressing size data which describes in block units a size of an area of "occurring position of a word within a document" data for use in an index for information retrieval, and storing the compressed size data therein;

an expansion device restoring said size data; and a retrieval device retrieving a database by the use of said original data restored.

31. A computer-readable storage medium storing a program to perform the process of compressing given data according to a block-based coding method and then generating continuation flag information expressive of a length of compressed data in block units at a top part of the compressed data.

32. A computer-readable storage medium storing a program to perform the process of converting numerical data for use in an index for information retrieval into interim numerical data expressive of a smaller numerical value and then compressing the interim numerical data.

33. A computer-readable storage medium storing a program to perform the process of describing size data in block units, the size data expressing a size of an area of "occurring position of a word within a document" data for use in an index for information retrieval, and then compressing said size data.

34. A computer-readable storage medium storing a program to perform the process of determining a length of compressed in block units according to a block based coding method on the basis of continuation flag information at a top part of the compressed data and then restoring original data.

35. A computer-readable storage medium storing a program to perform the process of expanding data compressed by converting numerical data for use in an index for information retrieval into interim numerical data expressive of a smaller numerical value, and then converting the expanded numerical data into a larger numerical value.

36. A computer-readable storage medium storing a program to perform the process of expanding data compressed by describing in block units a size of an area of "occurring position of a word within a document" data for use in an index for information retrieval.

37. A data compression method comprising:

compressing given data according to a block-based coding method; and generating continuation flag information expressive of a length of compressed data in block units at a top part of the compressed data.

38. A data compression method comprising:

converting numerical data for use in an index for information retrieval into interim numerical data expressive of a smaller numerical value; and compressing the interim numerical data.

39. A data compression method comprising:

describing size data in block units, the size data expressing a size of an area of "occurring position of a word within a document" data for use in an index for information retrieval; and compressing said size data.

40. A data expansion method comprising:

determining a length of data compressed in block units according to a block-based coding method on the basis of continuation flag information at a top part of the compressed data; and restoring original data.

41. A data expansion method comprising:

expanding data compressed by converting numerical data for use in an index for information retrieval into interim numerical data expressive of a smaller numerical value; and converting the expanded numerical data into a larger numerical value.

42. A data expansion method comprising:

expanding data compressed by describing in block units a size of an area of "occurring position of a word within a document" data for use in an index for information retrieval.

43. A data compression apparatus comprising:

a compression device compressing given data in block units, and generating continuation flag information expressive of a length of compressed data at a top part of the compressed data;

a storage device storing said compressed data therein; and said compression device generates the continuation flag information expressive of a block length of said compressed data at the top part of said compressed data of at least one block, and generates data expressive of the given data so as to succeed said continuation flag information.

44. A data compression apparatus according to claim 43, wherein said compression device includes encoding means for encoding said given data with 4 bits as a unit of the block.

45. A data compression apparatus according to claim 43, wherein said compression device includes an encoding device encoding given numerical data of at most 127 with a block of 8 bits, and for encoding given numerical data of at least 128 with a top block of 8 bits and at least one succeeding block having 4 bits as a unit thereof.

46. A data compression apparatus according to claim 45, wherein said encoding device expresses the numerical data of at most 127 by "0" of one bit and a bit pattern of 7 bits.

47. A data compression apparatus according to claim 43, wherein said compression device includes an encoding device encoding given numerical data of at most 2 with a block of 2 bits, and encoding given numerical data of at least 3 with 4 bits as a unit of the block.

48. A data compression apparatus according to claim 47, wherein said encoding device expresses given numerical data of at least 3 and at most 6 by the continuation flag information of 2 bits and a bit pattern of 2 bits.

49. A data compression apparatus comprising:

a compression device for use in an index for information retrieval and compressing numerical data;

a storage device storing the compressed data therein; and said compression device compresses the interim numerical data with 4 bits as a unit of a block, and generates continuation flag information expressive of a block length of said compressed data at a top part of said compressed data.

50. A data compression apparatus comprising:

a compression device for use in an index for information retrieval and compressing the numerical data;

a storage device storing the compressed data therein; and said compression device expresses the interim numerical data for a numerical value of at most 2, by a block of 2 bits, and compresses the interim numerical data expressing a numerical value of at least 3, with 4 bits as a unit of a block.

51. A data compression apparatus according to claim 50, wherein said compression device expresses given numerical data of at least 3 and at most 6 by continuation flag information of 2 bits and a bit pattern of 2 bits.

52. A data expansion apparatus comprising:

a storage device storing therein data compressed in block units;

an expansion device determining a length of the compressed data on the basis of continuation flag information at a top part of said compressed data, and then restoring original data;

said expansion device derives data expressive of the original data succeeding the continuation flag information, on the basis of said continuation flag information expressive of a block length of said compressed data of at least one block, and then restores said original data;

said expansion device includes a decoding device decoding a code given as said compressed data and described with 4 bits as a unit of a block.

53. A data expansion apparatus comprising:

a storage device storing therein data compressed in block units;

an expansion device determining a length of the compressed data on the basis of continuation flag information at a top part of said compressed data, and then restoring original data;

said expansion device derives data expressive of the original data succeeding the continuation flag information, on the basis of said continuation flag information expressive of a block length of said compressed data of at least one block, and then restores said original data; and said expansion device includes a decoding device decoding one block of 8 bits given as said compressed data, thereby to generate numerical data of at most 127, and decoding a top block of 8 bits and at least one succeeding block having 4 bits as a unit thereof, the blocks having been given as said compressed data, thereby to generate numerical data of at least 128.

54. A data expansion apparatus according to claim 53, wherein said decoding device generates the numerical data of at most 127 when said one block of 8 bits is composed of "0" of one bit and a bit pattern of 7 bits.

55. A data expansion apparatus comprising:

a storage device storing therein data compressed in block units;

an expansion device determining a length of the compressed data on the basis of continuation flag information at a top part of said compressed data, and then restoring original data;

said expansion device derives data expressive of the original data succeeding the continuation flag information, on the basis of said continuation flag information expressive of a block length of said compressed data of at least one block, and then restores said original data; and said expansion device includes a decoding device decoding one block of 2 bits given as said compressed data, thereby to generate numerical data of at most 2, and decoding at least one block having 4 bits as a unit thereof and given as said compressed date, thereby to generate numerical data of at least 3.

56. A data expansion apparatus according to claim 55, wherein said decoding device generates numerical data of at least 3 and at most 6 when said compressed data is composed of said continuation flag information of 2 bits and a bit pattern of 2 bits.

57. A data compression apparatus comprising:

a compression device compressing data by generating a block of continuation flag information and compressing data into compressed data blocks using a block-based method; and a storage device storing the continuation flag information on top of the compressed data blocks.

58. A data compression method comprising:

generating a block of continuation flag information;

compressing data using a block based method into compressed data blocks; and concatenating the continuation flag information on top of the compressed data blocks.

* * * * *